United States Patent
Majid et al.

(10) Patent No.: US 10,892,604 B2
(45) Date of Patent: Jan. 12, 2021

(54) FIBER OPTIC PHOTON ENGINE

(71) Applicant: Nanjing Casela Technologies Corporation Limited, Jiangsu (CN)

(72) Inventors: Imtiaz Majid, Shrewsbury, MA (US); Chih-Hao Wang, Brimfield, MA (US); Peng-Chih Li, Los Altos, CA (US)

(73) Assignee: Nanjing Casela Technologies Corporation Limited, Jiangsu (CN)

( * ) Notice: Subject to any disclaimer, the term of this patent is extended or adjusted under 35 U.S.C. 154(b) by 0 days.

(21) Appl. No.: 16/959,049

(22) PCT Filed: Dec. 27, 2018

(86) PCT No.: PCT/IB2018/001577
§ 371 (c)(1),
(2) Date: Jun. 29, 2020

(87) PCT Pub. No.: WO2019/130060
PCT Pub. Date: Jul. 4, 2019

(65) Prior Publication Data
US 2020/0343684 A1    Oct. 29, 2020

Related U.S. Application Data

(60) Provisional application No. 62/611,855, filed on Dec. 29, 2017.

(51) Int. Cl.
*H01S 5/00* (2006.01)
*H01S 5/40* (2006.01)
(Continued)

(52) U.S. Cl.
CPC .......... *H01S 5/4012* (2013.01); *H01S 5/0071* (2013.01); *H01S 5/02284* (2013.01);
(Continued)

(58) Field of Classification Search
CPC .. H01S 5/0071; H01S 5/02284; H01S 5/4012; H01S 5/4056; H01S 5/4075; H01S 5/4031; H01S 5/02469
See application file for complete search history.

(56) References Cited

U.S. PATENT DOCUMENTS

| 5,877,858 A * | 3/1999 | Kerstens | G01B 11/2441 356/496 |
| 6,873,639 B2 * | 3/2005 | Zhang | H01S 3/109 372/69 |

(Continued)

FOREIGN PATENT DOCUMENTS

| EP | 2202550 A1 | 6/2010 |
| JP | 2005300954 A | 10/2005 |

(Continued)

OTHER PUBLICATIONS

International Search Report and Written Opinion for International PCT Application No. PCT/IB2018/001580 dated Aug. 6, 2019.

(Continued)

*Primary Examiner* — Kinam Park
(74) *Attorney, Agent, or Firm* — K&L Gates LLP

(57) ABSTRACT

An aspect of a photon source may have a substrate with a surface, a focus lens disposed above the surface, and a plurality of optical sources. Each optical source may be composed of a mirror and an optical emitter. The optical emitter may include a beam twister. The emitter is aligned with the mirror along an axis and may emit a collimated beam along the axis. A plurality of mirrors may be composed of each mirror of the plurality of optical sources, arranged in a first ring-like configuration. Alternatively, the plurality of mirrors may be aggregated into a polygonal pyramidal mirror. A plurality of emitters may be composed of each emitter of the plurality of optical sources, arranged in a second ring-like configuration. The optical emitters may be (Continued)

composed of a laser diode mounted on a sub-mount having a plane orthogonal to the planar surface.

24 Claims, 18 Drawing Sheets

(51) Int. Cl.
  *H01S 5/022* (2006.01)
  *H01S 5/024* (2006.01)
(52) U.S. Cl.
  CPC .......... *H01S 5/4031* (2013.01); *H01S 5/4056* (2013.01); *H01S 5/4075* (2013.01); *H01S 5/02469* (2013.01)

(56) References Cited

U.S. PATENT DOCUMENTS

| | | | |
|---|---|---|---|
| 6,969,820 B2 | 11/2005 | Hayashi et al. | |
| 8,186,069 B1* | 5/2012 | Ho | G01B 11/27 33/286 |
| 9,413,136 B1 | 8/2016 | Vethake et al. | |
| 10,286,487 B2* | 5/2019 | Kancharla | B23K 26/0665 |
| 2005/0018981 A1 | 1/2005 | Modavis et al. | |
| 2005/0135655 A1 | 6/2005 | Kopf-Sill et al. | |
| 2012/0320355 A1* | 12/2012 | Maeda | G03B 21/2066 355/67 |
| 2017/0235057 A1 | 8/2017 | Hemenway et al. | |
| 2017/0299956 A1* | 10/2017 | Holland | H01S 5/02 |
| 2019/0280458 A1* | 9/2019 | Dykaar | H01S 5/0014 |
| 2020/0200363 A1* | 6/2020 | Harrison | H01S 5/02236 |

FOREIGN PATENT DOCUMENTS

| | | |
|---|---|---|
| JP | 2014228797 A | 12/2014 |
| JP | 2016075921 A | 5/2016 |
| KR | 101455800 B1 | 11/2014 |
| WO | 2014134470 A1 | 9/2014 |
| WO | 2019130060 A2 | 7/2019 |
| WO | 2019130062 A2 | 7/2019 |
| WO | 2019130065 A2 | 7/2019 |

OTHER PUBLICATIONS

International Search Report and Written Opinion for International PCT Application No. PCT/IB2018/001577 dated Aug. 5, 2019.
International Search Report and Written Opinion for International PCT Application No. PCT/IB2018/001590 dated Jul. 10, 2019.

* cited by examiner

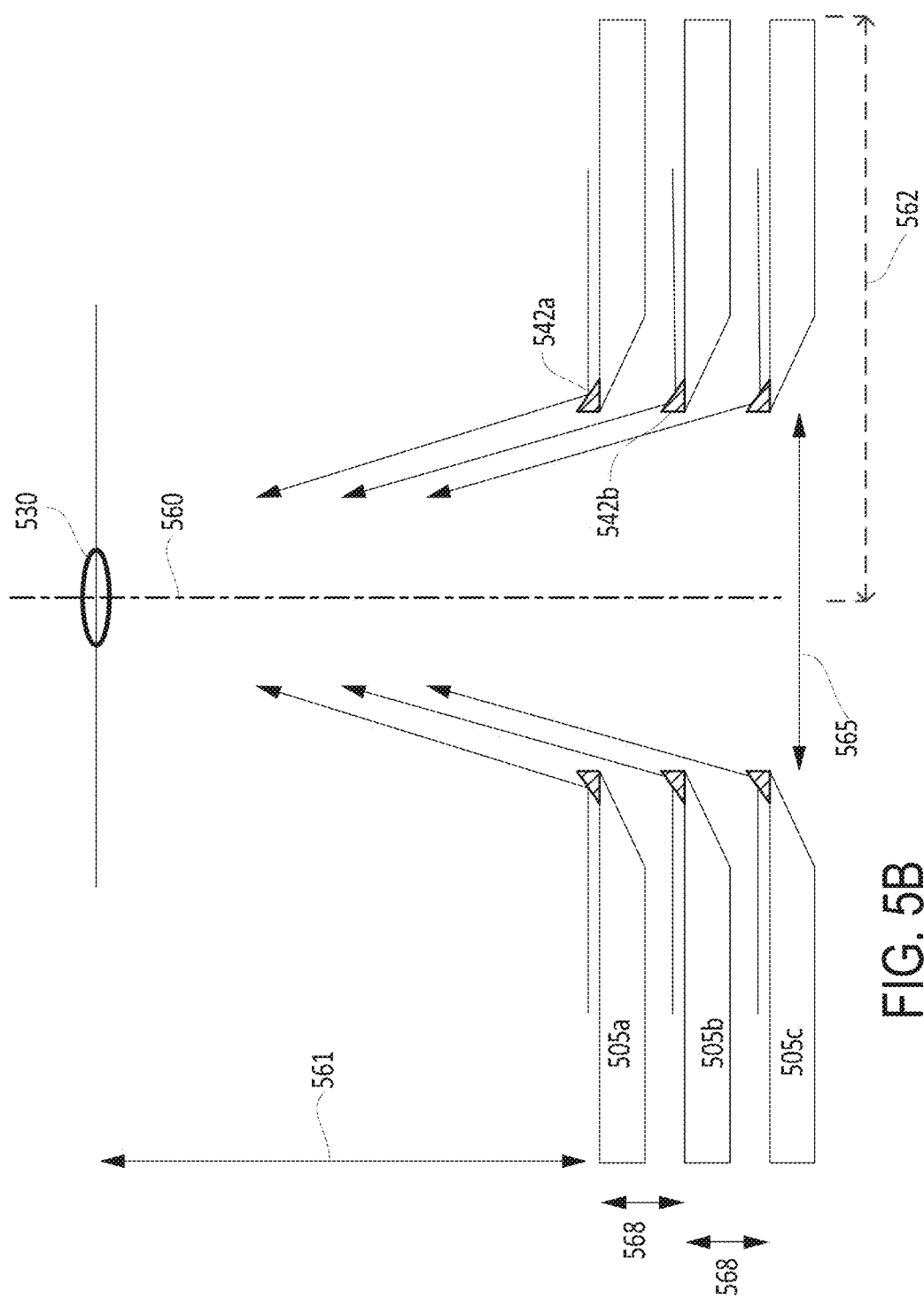

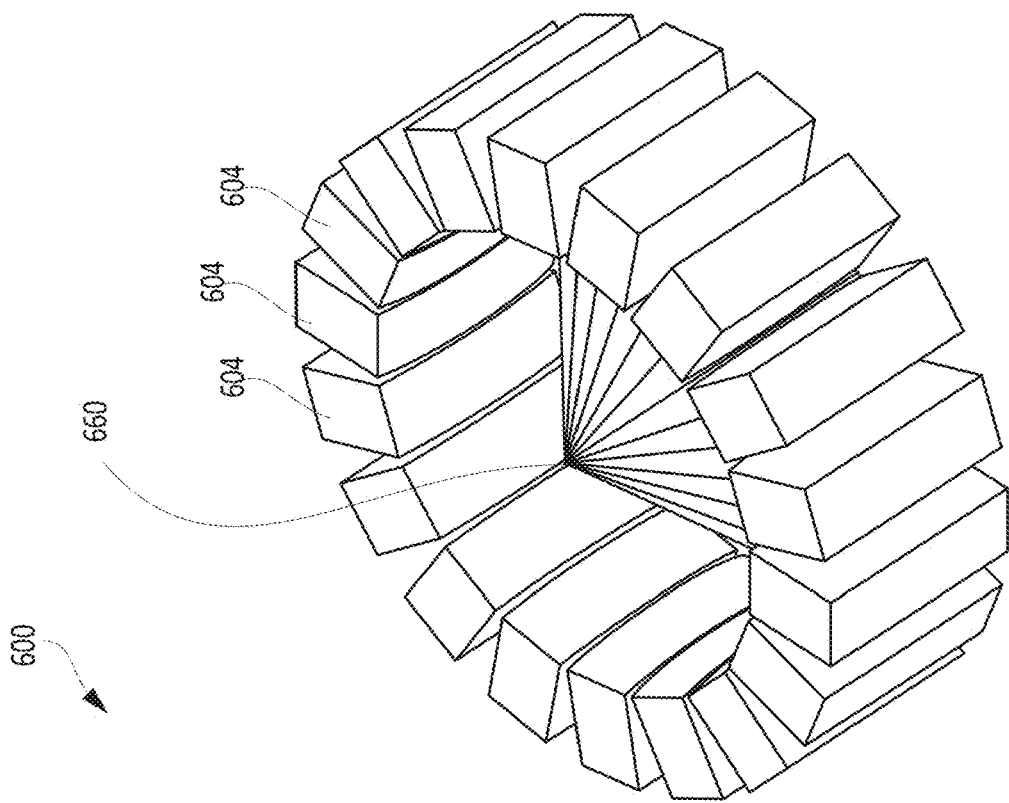
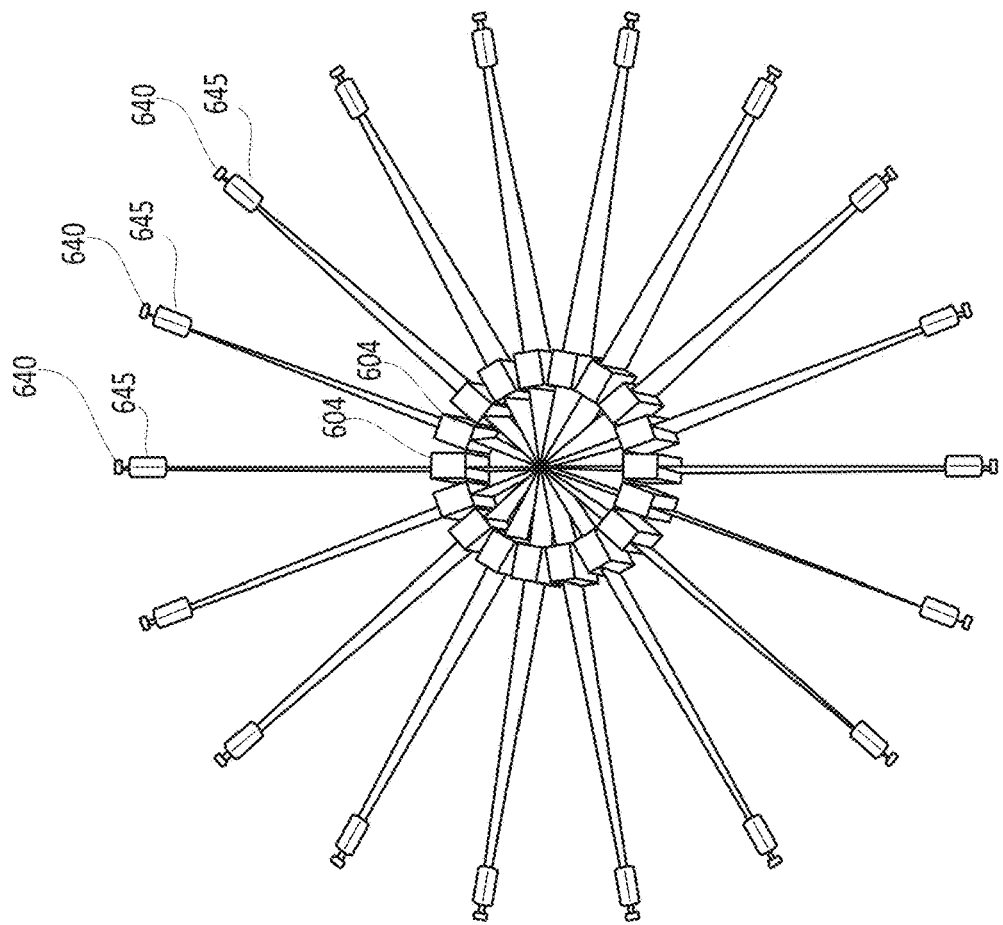
FIG. 6A
FIG. 6B

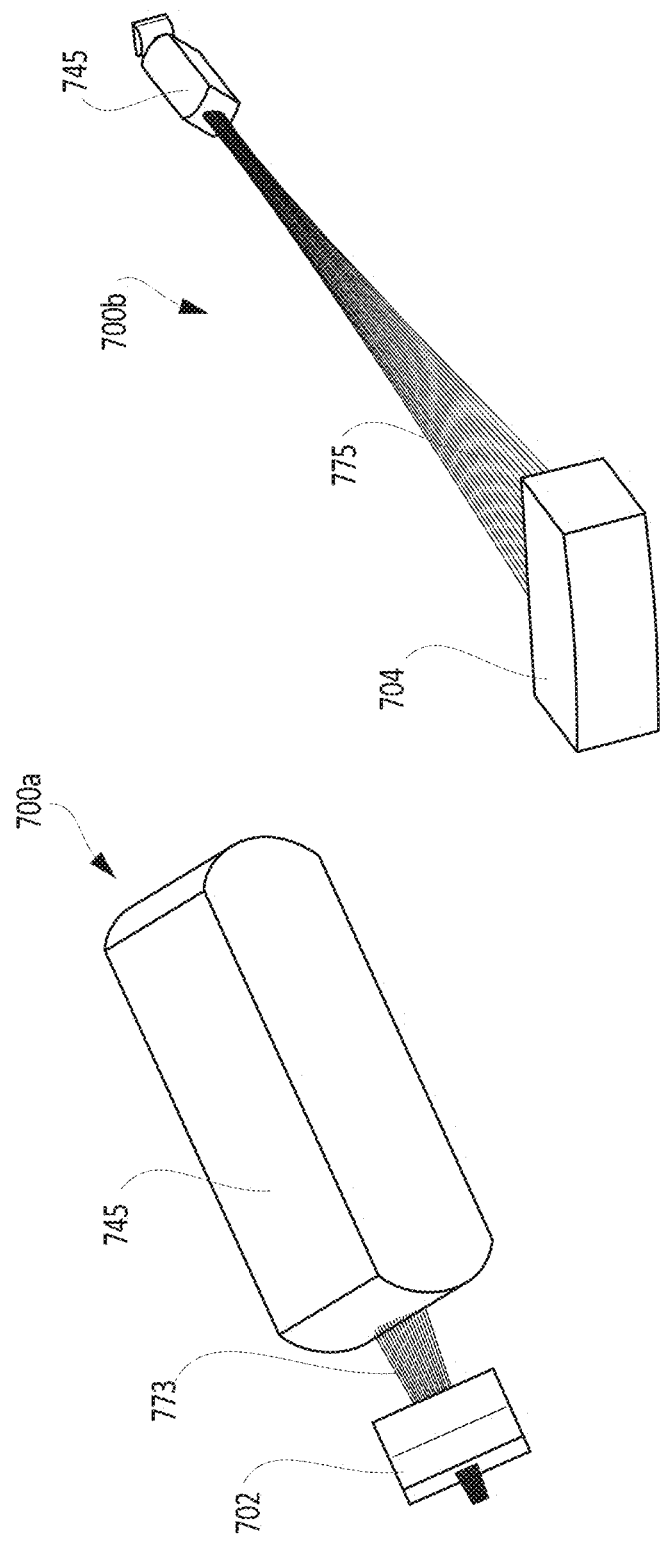

FIBER OPTIC PHOTON ENGINE

CROSS-REFERENCE TO RELATED APPLICATIONS AND STATEMENT OF PRIORITY

This application is a national stage application filed under 35 U.S.C. § 371 claiming benefit of and priority to International Application serial number PCT/IB2018/001580 entitled FIBER PHOTON ENGINE COMPRISING CYLINDRICALLY ARRANGED PLANAR RING OF DIODES COUPLED INTO A CAPILLARY/SHELL FIBER filed Dec. 27, 2018, which further claims benefit of and priority to U.S. Provisional Application Ser. No. 62/611,855 entitled FIBER OPTIC PHOTON ENGINE filed Dec. 29, 2017, the disclosures of all of which are incorporated herein by reference in their entirety and for all purposes. Applicant of the present patent application is also the owner of the following applications, each of which in herein incorporated by reference in its entirety and for all purposes:

- PCT Patent Application serial number PCT/IB2018/001580 filed Dec. 27, 2018 entitled FIBER PHOTON ENGINE COMPRISING CYLINDRICALLY ARRANGED PLANAR RING OF DIODES COUPLED INTO A CAPILLARY/SHELL FIBER;
- PCT Patent Application serial number PCT/IB2018/001590 filed Dec. 27, 2018, entitled PHOTON SOURCE COMPRISING A PLURALITY OF OPTICAL SOURCES AND AN OPTICAL SHELL TO RECEIVE THE LIGHT EMITTED BY THE OPTICAL SOURCE;
- U.S. patent application Ser. No. 16/958,810, filed Jun. 29, 2020, entitled FIBER PHOTON ENGINE COMPRISING CYLINDRICALLY ARRANGED PLANAR RING OF DIODES COUPLED INTO A CAPILLARY/SHELL FIBER; and
- U.S. patent application Ser. No. 16/959,057 filed Jun. 29, 2020, entitled PHOTON SOURCE COMPRISING A PLURALITY OF OPTICAL SOURCES AND AN OPTICAL SHELL TO RECEIVE THE LIGHT EMITTED BY THE OPTICAL SOURCE.

BACKGROUND

Laser light has been used in a number of applications including, without limitation, telecommunications, medicine, research, and industrial applications. The required application may determine the power of the laser light necessary, from low power applications (for example optical metrology) to high power applications (for example industrial cutting and welding applications). High power lasers may be of particular use in automated or robotic cutting stations for repeatable high precision cutting of material such as steel and other metals. Various types of lasers may include, without limitation, gas lasers, chemical lasers, dye lasers, metal-vapor lasers, solid-state lasers, and semiconductor lasers. Of the types of lasers available, semiconductor lasers may have the highest electrical-to-optical efficiency, which may exceed 50%. It may be understood that a high efficiency laser may be preferred for its ability to convert more electrical power to output optical power than lower efficiency lasers. However, the power output of a single semiconductor laser is fairly low compared to other types of lasers.

Therefore, it would be highly desirable to combine the output of multiple semiconductor lasers to produce a high power output laser beam that may take advantage of the efficiency of the electrical-to-optical power conversion of the semiconductor lasers.

SUMMARY

In one aspect, a photon source may be composed of a substrate defining a planar surface, a focus lens disposed above the planar surface, the focus lens defining an acceptance angle, and a plurality of optical sources. Each optical source may have a mirror disposed on the substrate having a reflecting surface defining a first predetermined angle relative to the planar surface of the substrate, and an optical emitter composed of a beam twister and disposed on the substrate, in which the optical emitter is optically aligned with the mirror along an optical axis and configured to emit a collimated optical beam along the optical axis. In some aspects, the reflecting surface may be configured to reflect the collimated optical beam incident on the reflecting surface away from the planar surface of the substrate at a second predetermined angle relative to the planar surface of the substrate. In one aspect, the mirror may be configured to reflect the collimated optical beam within the acceptance angle of the focus lens. In one aspect, a plurality of mirrors may collectively be composed of each mirror of the plurality of optical sources, and the plurality of mirrors may be arranged in a first ring-like configuration defining a first diameter, in which the focus lens is disposed above the first ring-like configuration of the plurality of mirrors. In one aspect, a plurality of optical emitters may be collective composed of each optical emitter of the plurality of optical sources, and the plurality of optical emitters may be arranged in a second ring-like configuration defining a second diameter. In one aspect, the first diameter is smaller than the second diameter and the second ring-like configuration is concentric with the first ring-like configuration.

An aspect of a photon source may be composed of a substrate defining a planar surface, a focus lens disposed above the planar surface, the focus lens defining an acceptance angle, and a plurality of optical sources. In one aspect, each optical source may be composed of a mirror having a reflecting surface defining a first predetermined angle relative to the planar surface of the substrate, and an optical emitter having a beam twister and disposed on the substrate wherein the optical emitter is optically aligned with the mirror along an optical axis and configured to emit the collimated optical beam along the optical axis. In one aspect, the reflecting surface may be configured to reflect a collimated optical beam incident on the reflecting surface away from the planar surface of the substrate at a second predetermined angle relative to the planar surface of the substrate. In one aspect, the mirror may be configured to reflect the collimated optical beam within the acceptance angle of the focus lens. In one aspect, each mirror of the plurality of optical sources forms a side of a polygonal pyramid disposed on the planar surface of the substrate, the polygonal pyramid having a pyramidal axis and a base defining a first diameter, in which the focus lens may be disposed above the polygonal pyramid. In one aspect, a plurality of optical emitters may be collectively composed of each optical emitter of the plurality of optical sources, and the plurality of optical emitters may be arranged in a ring-like configuration defining a longitudinal ring axis orthogonal to the planar surface and a second diameter, in which the first diameter is smaller than the second diameter and the pyramidal axis is coaxial with the longitudinal ring axis.

An aspect of a photon source may be composed of a substrate defining a planar surface, a focus lens disposed above the planar surface, the focus lens defining an acceptance angle, and a plurality of optical sources. In one aspect, each optical source may be composed of a mirror disposed on the substrate having a reflecting surface defining a first predetermined angle relative to the planar surface of the substrate, and an optical emitter disposed on the substrate. In one aspect, the optical emitter may be optically aligned with the mirror along an optical axis and configured to emit a collimated optical beam along the optical axis. In one aspect, the reflecting surface may be configured to reflect the collimated optical beam incident on the reflecting surface away from the planar surface of the substrate at a second predetermined angle relative to the planar surface of the substrate. In one aspect, the optical emitter may be composed of a laser diode configured to emit an optical beam from an output facet, in which the laser diode is mounted on a sub-mount having a sub-mount plane orthogonal to the planar surface. In one aspect, the mirror may be configured to reflect the collimated optical beam within the acceptance angle of the focus lens. In one aspect, a plurality of mirrors may collectively be composed of each mirror of the plurality of optical sources, and the plurality of mirrors may be arranged in a first ring-like configuration defining a first diameter, in which the focus lens is disposed above the first ring-like configuration of the plurality of mirrors. In one aspect a plurality of optical emitters may be collectively composed of each optical emitter of the plurality of optical sources, and the plurality of optical emitters may be arranged in a second ring-like configuration defining a second diameter, in which the first diameter is smaller than the second diameter and the second ring-like configuration is concentric with the first ring-like configuration.

BRIEF DESCRIPTION OF THE FIGURES

The features of the various aspects are set forth with particularity in the appended claims. The various aspects, however, both as to organization and methods of operation, together with advantages thereof, may best be understood by reference to the following description, taken in conjunction with the accompanying drawings as follows:

FIGS. 5A and 5B illustrate a schematic perspective view and a plan side view, respectively, of a third aspect of a laser photon source according to one aspect of the present disclosure.

FIG. 6A is an illustration of a fourth aspect of a laser photon source according to one aspect of the present disclosure.

FIG. 6B is an illustration of multiple optical emitters disposed about a polygonal pyramid in which the individual faces of the polygonal pyramid form mirror surfaces for the fourth aspect of a laser photon source as depicted in FIG. 6A, according to one aspect of the present disclosure.

FIG. 7 is an illustration of the use of a beam twister for the fourth aspect of a laser photon source as depicted in FIG. 6A, according to one aspect of the present disclosure.

DETAILED DESCRIPTION

Various aspects are described to provide an overall understanding of the structure, function, manufacture, and use of the devices and methods disclosed herein. One or more examples of these aspects are illustrated in the accompanying drawings. Those of ordinary skill in the art will understand that the devices and methods specifically described herein and illustrated in the accompanying drawings are non-limiting aspects and that the scope of the various aspects is defined solely by the claims. The features illustrated or described in connection with one aspect may be combined, in whole or in part, with the features of other aspects. Such modifications and variations are intended to be included within the scope of the claims.

The present disclosure describes a variety of aspects of a laser photon source. In some aspects, the present disclosure is directed to a laser photon source including a plurality of optical emitters, in which each optical emitter is disposed on a substrate and wherein each optical emitter is optically aligned with a mirror along an optical axis and configured to emit a collimated optical beam along the optical axis. In some aspects, a plurality of mirrors comprises a combination of the mirrors and the plurality of mirrors is arranged in a first ring-like configuration defining a first diameter, and wherein a plurality of optical emitters is arranged in a second ring-like configuration defining a second diameter.

It is to be understood that this disclosure is not limited to particular aspects or aspects described, as such may vary. It is also to be understood that the terminology used herein is for the purpose of describing particular aspects or aspects only, and is not intended to be limiting, since the scope of the apparatus, system, and method for combining the optical power of a large number of semi-conductor lasers, and coupling this power into an optical fiber is defined only by the appended claims.

Figure 1A:
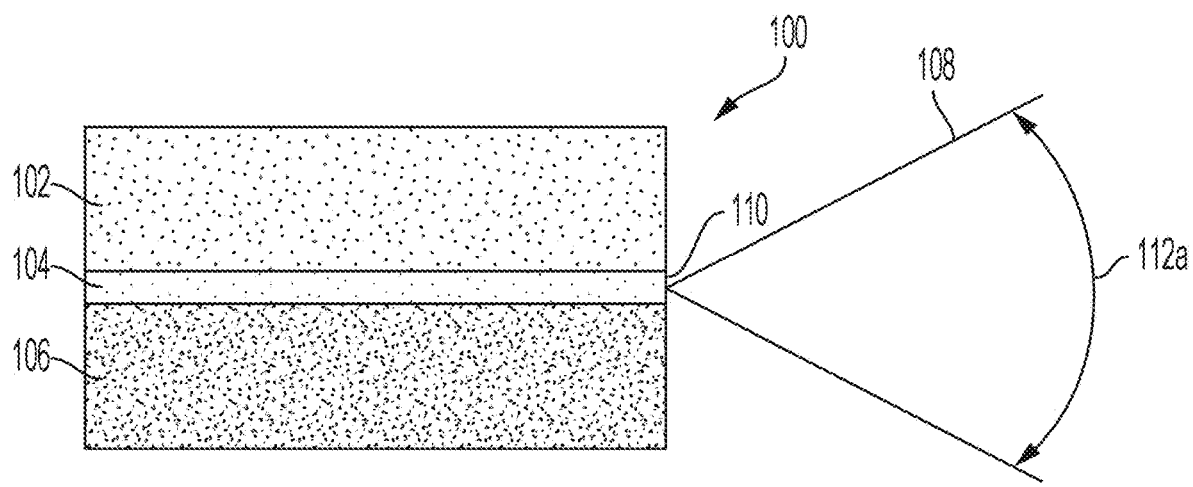
FIGS. 1A and 1B are schematic illustrations of a side plan view and a top plan view, respectively, of a laser diode according to one aspect of the present disclosure.
Figure 1B:
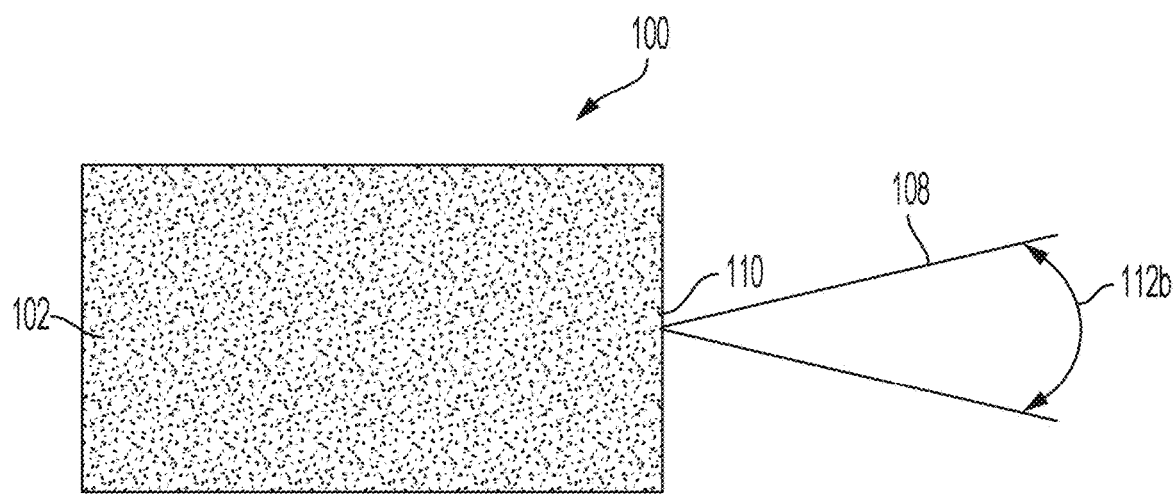

FIGS. 1A and 1B depict a side view and a top view, respectively, of a laser diode 100. The laser diode 100 may have a p-i-n structure including a p-cladding section 102, an n-cladding section 106, and an intrinsic layer 104 disposed therebetween. The intrinsic layer 104 is the active layer where charge carriers are injected from the p-cladding section 102 and the n-cladding section 106 when the diode 100 is forward biased. The charge carriers in the intrinsic region 104 may recombine under stimulated emission producing the laser output light 108 emitted from the output facet 110. The output light 108 divergence 112b along an axis co-planar with the active region is much less than the output light divergence 112a along an axis orthogonal to the plane of the active region. The co-planar axis having the low light divergence 112b is frequently termed the "slow-axis" and the orthogonal axis having the high light divergence 112a is frequently termed the "fast-axis." The laser output light 108 is generally polarized in the slow-axis plane.

Figure 2:
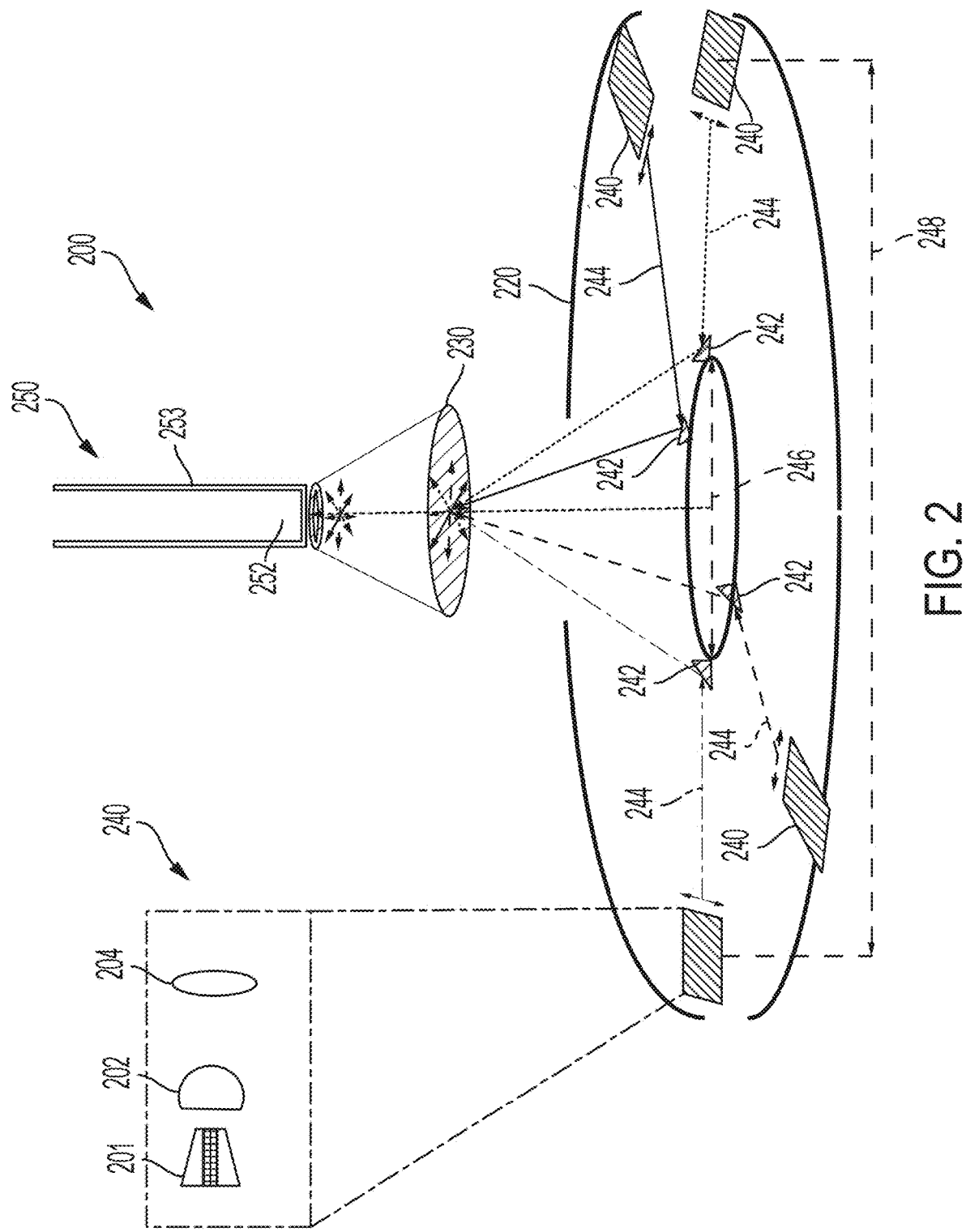
FIG. 2 is an illustration of a first aspect of a laser photon source according to one aspect of the present disclosure.

FIG. 2 depicts a first aspect of a laser photon source 200. In some aspects, the laser photon source 200 may include a substrate 220 defining a planar surface, a focus lens 230 defining an acceptance angle disposed above the planar surface, and a plurality of optical sources. The substrate 220 may include any number of optical sources disposed thereon. The focus lens 230 may act to focus laser light emitted by each of the optical sources onto an end surface of an optical fiber core 252 of an optical fiber 250. The optical fiber 250 may also include an external cladding 253. In some aspects, the optical fiber 250 may be an optical fiber cable. Each optical source may include a mirror 242 disposed on the substrate 220 having a reflecting surface defining a first predetermined angle relative to the planar surface of the substrate 220. Each mirror 242 reflecting surface may be configured to reflect a collimated optical beam incident on the reflecting surface away from the planar surface of the substrate 220 at a second predetermined angle relative to the planar surface of the substrate 220. Each optical source may also include an optical emitter 240 disposed on the substrate 220 in which the optical emitter 240 is optically aligned with the mirror 242 along an optical axis 244 and configured to emit the collimated optical beam along the optical axis 244. Each mirror 242 may be configured to reflect the collimated optical beam within the acceptance angle of the focus lens 230. Further, a plurality of mirrors may be defined as a combination of each mirror 242 of the plurality of optical sources, and the plurality of mirrors may be arranged in a first ring-like configuration defining a first diameter 246. The focus lens 230 may be disposed above the first ring-like configuration of the plurality of mirrors, Further, a plurality of optical emitters may be defined as a collection of each optical emitter 240 of the plurality of optical sources, and the plurality of optical emitters may be arranged in a second ring-like configuration defining a second diameter 248. The first diameter 246 of the plurality of mirrors is smaller than the second diameter 248 of optical emitters, and the second ring-like configuration is concentric with the first ring-like configuration.

The plurality of optical sources disposed on the substrate may posses an N-fold rotational axis of symmetry orthogonal to the planar surface of the substrate 220, in which N is an integer that ranges from about 2 to about 50 depending on the size of the emitters and their individual angular divergences of the diodes 201. Non-limiting examples of the N-fold rotational axis of symmetry may have a value of N of about 2, about 3, about 4, about 5, about 10, about 15, about 20, about 30, about 40, about 50, or any integer value therebetween including endpoints.

In some aspects, the substrate 220 defines a circular periphery. In some aspects, the substrate 200 may define a polygonal periphery comprising a plurality of sides. In some aspects, the plurality of sides may range from 2 to 50. Non-limiting examples of the number of polygonal sides may be about 2, about 3, about 4, about 5, about 10, about 15, about 20, about 30, about 40, about 50, or any integer value therebetween including endpoints. In some aspects, each optical emitter 240 of the plurality of optical sources is disposed adjacent to one of the plurality of sides of the polygonal periphery.

The optical emitter 240 of each of the plurality of optical sources may include a laser diode 201 configured to emit an optical beam (108, see FIGS. 1A,B), from an output facet (110, see FIGS. 1A,B) Each laser diode 201 may be mounted on the substrate 220, which may be configured to dissipate heat generated by each laser diode 201 when each laser diode 201 receives electrical power. The emitted optical beam (108, see FIGS. 1A,B) by each laser diode 201 may have a wavelength in a range of about 200 nm to about 2000 nm. In some non-limiting examples, the wavelength of the emitted optical beam (108, see FIGS. 1A,B) by each laser diode 201 may have a wavelength of about 200 nm, about 300 nm, about 400 nm, about 500 nm, about 700 nm, about 1000 nm, about 1100 nm, about 1200 nm, about 1500 nm, about 2000 nm, or any value or range of values therebetween including endpoints.

In some aspects, the set of reflecting mirrors 242, also arranged in a ring like fashion, can reflect over a variety of angles. In some aspects, the angle is about 45 degrees so that the reflected beam is perpendicular to the disk. In some other aspects, the mirror angle may range between about 30 degrees and about 60 degrees. However, it may be recognized that the mirror angle may be larger or smaller than this range depending on the incorporation of additional lenses to receive the light reflected from the mirrors In some aspects, multiple lenses differing in their optical properties may be included and disposed between the mirrors and an end surface of an optic fiber or an optic fiber coupler. In some non-limiting examples, the mirror angle may have a value of about 10 degrees, about 15 degrees, about 20 degrees, about 25 degrees, about 30 degrees, about 35 degrees, about 40 degrees, about 45 degrees, about 50 degrees, about 55 degrees, about 60 degrees, about 65 degrees, about 70 degrees, or any value or range of values therebetween including endpoints.

In some aspects, the ring of mirrors can take on different shapes, including a polygon of N-sides, in which N can range anywhere from 2 to a larger number such as 50. Non-limiting examples of the number of polygonal sides N may be about 2, about 3, about 4, about 5, about 10, about 15, about 20, about 30, about 40, about 50, or any integer value therebetween including endpoints. In some aspects, the plurality of mirrors may be cylindrically arranged.

Although FIG. 2 depicts the plurality of mirrors as comprising a plurality of individual mirrors 242, it may be recognized that the mirrors may be defined as the sides of a polygonal pyramid disposed on the planar surface of the substrate 220, the polygonal pyramid having a base defining the first diameter. The polygonal pyramid may have the same number of sides as the number of optical emitters 240 (see FIG. 6B).

Additionally, each optical emitter 240 may include a first collimating lens 202 optically aligned with the laser diode 201, in which the first collimating lens 202 (a fast-axis lens) is configured to collimate the optical beam emitted from the laser diode 201 along the fast-axis. A second collimating lens 204 (a slow-axis lens) may be optically aligned with the fast-axis lens 202 and the output facet (110, see FIGS. 1A,B) in which the slow-axis lens 204 is configured to collimate the optical beam emitted from the fast-axis lens 202 along the slow-axis of the laser diode 201.

Figure 3A:
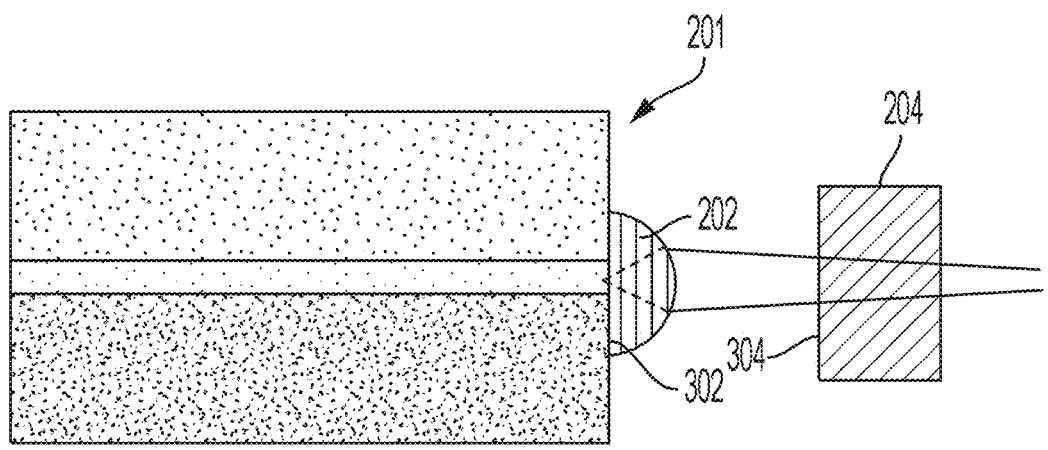
FIGS. 3A and 3B are schematic illustrations of a side plan view and a top plan view, respectively, of an optical emitter including a laser diode, a fast-axis collimating lens, and a slow-axis collimating lens, according to one aspect of the present disclosure.
Figure 3B:
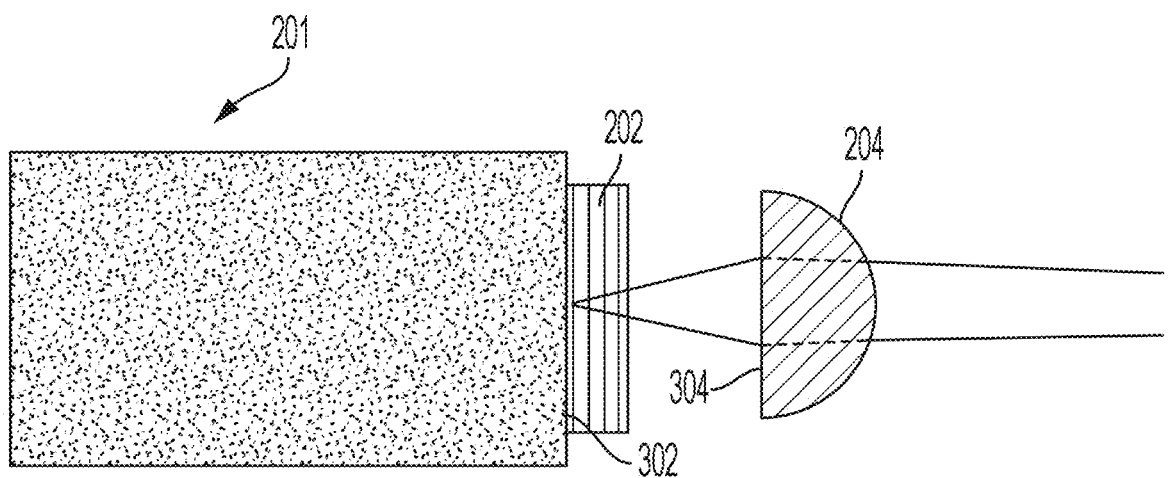

FIGS. 3A and 3B depict the disposition of the fast-axis collimating lens and the slow-axis collimating lens. FIG. 3A, a side view of laser diode 201, depicts the effect of the fast-axis collimating lens 202 on the fast-axis divergence of the light emitted by the laser diode 201. FIG. 3b, a top view of the laser diode 201 depicts the effect of the slow-axis collimating lens 204 on the slow-axis divergence of the light emitted by the laser diode 201. In some aspects, each of the fast-axis collimating lens 202 and the slow-axis collimating lens 204 may be an aspheric cylindrical lens having a high numerical aperture. In some aspects, the fast-axis collimating lens 202 may have a non-reflective coating on its optical input side 302 and the slow-axis collimating lens 204 may have a non-reflective coating on its optical input side 304.

In some additional aspects, as depicted in FIG. 2, the laser photon source 200 may further include an optical coupler configured to receive an optical output of the focus lens 230 at a first coupler surface, and to receive an end of a fiber optic cable (for example, optical fiber 250) at a second coupler surface In this aspect, the focusing lens 230 may focus the beam(s) of light reflected by the plurality of mirrors onto the end-face of an optical fiber 250 and to have it coupled efficiently. The numerical aperture of the focusing lens 230 (or its acceptance angle) should be matched to the diameter of the ring of mirrors (first diameter 246) and the numerical aperture of the optical fiber 250.

Figure 4:
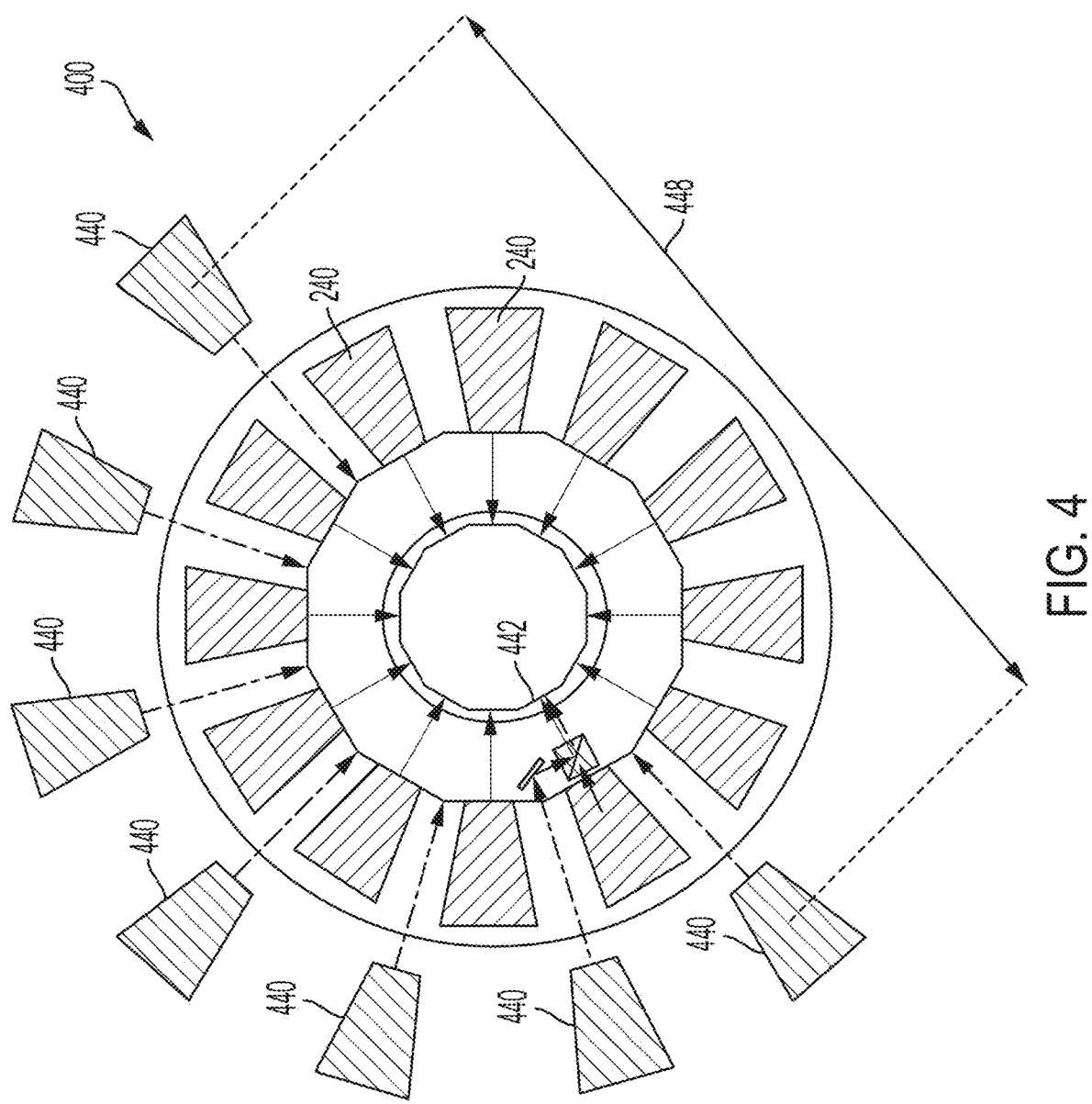
FIG. 4 is an illustration of a second aspect of a laser photon source according to one aspect of the present disclosure.

FIG. 4 depicts a second aspect of a photon source 400. The aspect of the photon source 400 depicted in FIG. 4 extends the geometry of the aspect of the photon source 200 depicted in FIG. 2 in that a second plurality of optical emitters 440 forming a second ring is included to the first plurality of optical emitters 240. It may be understood that the first plurality of optical emitters 240 in FIG. 4 may have the same components as that plurality of optical emitters 240 disclosed with respect to FIG. 2. Thus, the first plurality of optical emitters 240 in FIG. 4 may include a laser diode, a fast-axis collimating lens optically aligned with the laser diode, and a slow-axis collimating lens optically aligned with the fast-axis collimating lens.

The output of each optical emitter 440 in the second, and outer, ring of optical emitters is optically coupled to the output of an optical emitter 240 in the first, and inner, ring of optical emitters. It may be understood that a diameter 448 of the outer ring of optical emitters 440 may be larger than the diameter 248 of the inner ring of optical emitters 240 (as depicted in FIG. 2). In some aspects, the optical emitters 440 may contain similar components as those of the optical emitters 240, including, without limitation, a laser diode, a fast-axis collimating lens, and a slow-axis collimating lens. In this manner, the total brightness of the photon source 400 is doubled by doubling the number of optical emitters on the substrate (220, see FIG. 2) that can be coupled in to the optical fiber 250. It may be understood that the characteristics of the substrate used for the second aspect of the photon source 400 may have similar properties as previously disclosed with respect to the substrate 220 described for the aspect of the photon source 200. Such properties may include the shape and size of the substrate 220 as previously disclosed.

In some aspects, the output of the second (outer) ring laser diode may be combined with the output of an inner ring laser diode using polarization multiplexing. Polarization multiplexing may rely upon an optical combiner 445 configured to combine an emitted optical beam from a laser diode in the inner ring of optical emitters with an emitted optical beam from a laser diode in the outer ring of optical emitters. As depicted in FIG. 4, the optical combiner 445 may include a polarization beam converter comprising a half-wave plate and a polarization beam combiner. A coupling mirror 447 may be configured to reflect the optical output of an outer ring laser diode to the polarization beam combiner 445. The half wave plate may rotate the polarization of the optical output of an outer ring laser diode, thereby allowing the rotated optical output of an outer ring laser diode to be combined with the un-rotated optical output of an inner ring laser diode.

Although not illustrated in FIG. 4, the output of each laser diode, both of the inner ring of laser diodes and of the outer ring of laser diodes, is coupled to a fast-axis collimating lens and a slow-axis collimating lens. The optical output of the combined fast- and slow-axis collimating lenses impinges on the beam combiner and the half-wave plate (outer ring laser diode beams).

It may be recognized that the aspect of the photon source depicted in FIG. 4 may include any or all of the characteristics of the photon source depicted in FIG. 2, including, but not limited to, the disposition of the mirrors 242 and their angles with respect to the substrate surface, the types of laser diodes and their optical output characteristics, and the disposition of the optical emitters 240, 440 and optical sources about the mirrors 242 disposed on the substrate surface.

Figure 5A:
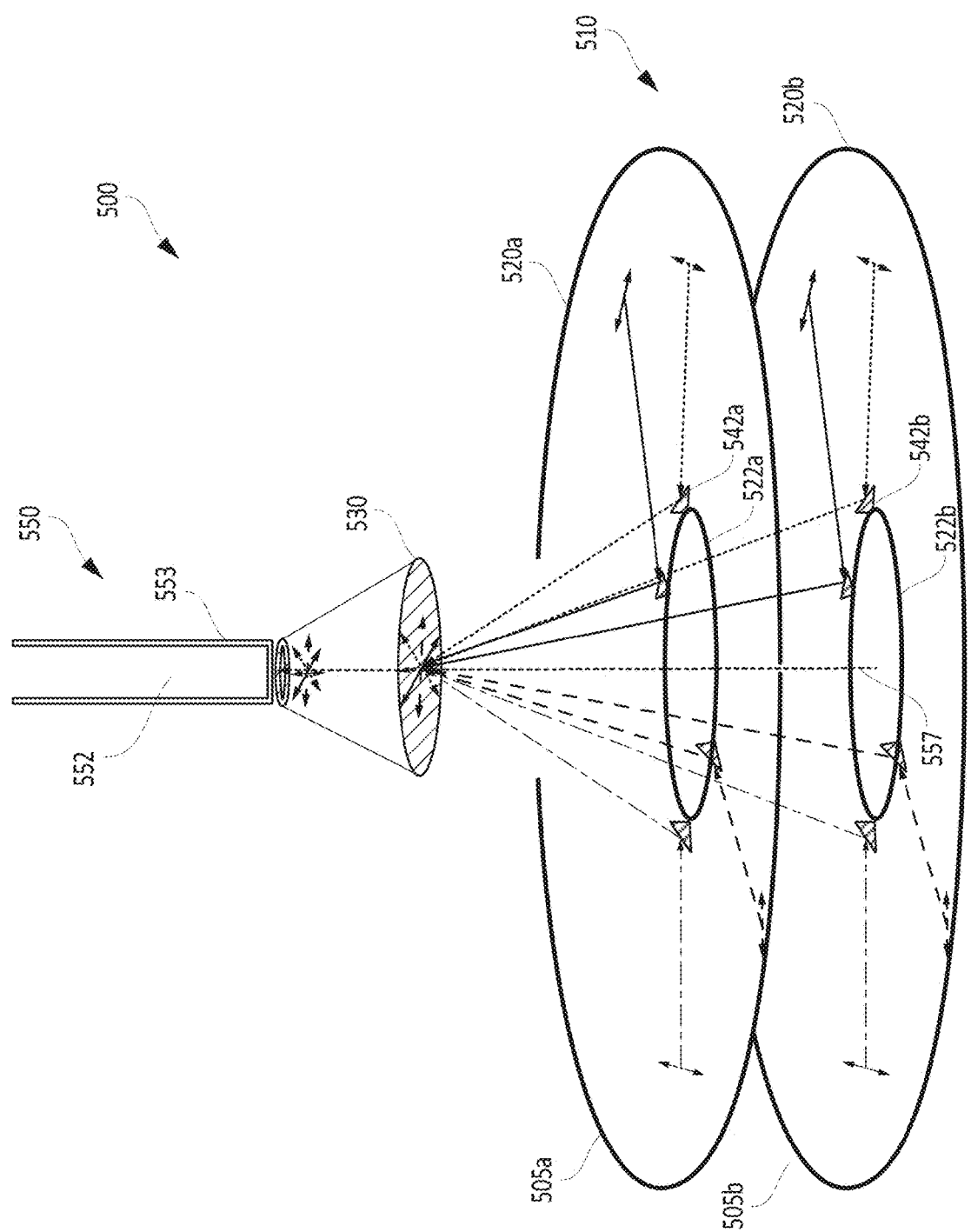

FIGS. 5A and 5B depict yet another aspect of a photon source 500. FIGS. 5A and 5B illustrate combining the output of multiple photon sources, such as those depicted in FIGS. 2 and 4, by stacking a plurality of such photon sources, as individual optical source layers disposed in a vertical array 510. FIG. 5A depicts two optical source layers 505a,b and FIG. 5B depicts three optical source layers 505a,b,c. Thus, each optical source layer 505a,b,c may include a plurality of optical sources, each optical source including one or more optical emitters that may incorporate a laser diode, a fast-axis collimating lens, a slow-axis collimating lens, and a mirror. It should be noted that the substrate 520a,b,c of each of the individual optical source layers 505a,b,c respectively, has an annular shape, including a spaced region 522a,b within the ring defined by the mirrors 542a,b. The substrate 520a,b of each optical source layer 505a,b, respectively, may have the various properties disclosed above with respect to the embodiments of photon sources 200 and 400.

The light reflected from the plurality of mirrors (such as 542a,b,c) from an individual optical source layer (such as 505a,b,c respectively) in the vertical array 510 may be transmitted through the spaced region of an individual optical source layer disposed above it in the vertical array 510. Thus, the light reflected from the plurality of mirrors (such as 542b) from the optical source layer 505b, may be transmitted through the spaced region 522a of optical source layer 505a. The laser light produced by each individual optical source layer 505a,b,c may be transmitted to the focusing lens 530 disposed above the vertical array 510 of optical source layers 505a,b,c. In one aspect, the focusing lens 530 may be disposed in a range of about 25 mm to about 100 mm above the top optical source layer 505a of the vertical array 510. In some non-limiting examples, the focusing lens 530 may be disposed at a distance above the top optical source layer 505a of about 25 mm, about 30 mm, about 40 mm, about 50 mm, about 60 mm, about 70 mm, about 80 mm, about 90 mm, about 100 mm, or at any value or range of values therebetween including end points. The focus lens 530 may act to focus laser light emitted by each of the optical source layers 505a,b onto an end surface of an optical fiber core 552 of an optical fiber 550. The optical fiber 550 may also include an external cladding 553. In some aspects, the optical fiber 550 may be an optical fiber cable.

The vertical array 510 may have a vertical array axis 560, and each optical source layer 505a,b,c may have an annular substrate axis (for example annular substrate axis 557 of optical source layer 505b) that may be coaxial with the vertical array axis 560. Each optical source layer 505a,b,c may be defined by a substrate radius (for example, substrate radius 562 of optical source layer 505c see FIG. 5B), In some aspects, the substrate radius 562 of a first annular substrate may be equal to the substrate radius 562 of a second annular substrate. In some aspects, the substrate radius 562 of a first annular substrate may differ from the substrate radius 562 of a second annular substrate.

The diameter of the spaced region 565 of the annular substrate of the second or third stacked optical source layer 505b,c can be different from each other so that the optical output of each optical source layer is vertical and travels unimpeded before impinging on the lens 530 (to avoid interference between different layers). Alternatively, the diameter of the spaced region 565 of the annular substrate of the second or third stacked optical source layer 505b,c can be the same since the mirrors on a lower optical source layer in the array may be tilted to a small angle. In this manner, each optical source layer 505a,b,c can have the same dimensions. In this aspect, the brightness of the light coupled into the fiber 550 will not be exactly doubled, but will be reduced by the angle that this beam of light subtends relative to the vertical. It may be recognized also that the angle deviation from the vertical of light emitted by an optical source layer 505a,b,c will depend on distance between adjacent layers and mirror 242 ring diameters. In one non-limiting example, the diameter of the spaced region 565 may be about 50 mm, although it may be recognized the that diameter of the spaced region 565 may have a value greater or less than this amount according to the manufacturing needs and power output requirement of the photon source.

In some aspects, the vertical array of photon sources may include 2 optical source layers to about 10 optical source layers. However, it should be recognized that more than 10 optical source layers may be included according to the manufacturing needs and power output requirement of the photon source 500. Non-limiting examples of the number of optical source layers may include 2 source layers, 3 source layers, 4 source layers, 5 source layers, 6 source layers, 7 source layers, 8 source layers, 9 source layers, or 10 source layers In some aspects, a vertical distance 568 between successive optical source layers (for example, a vertical distance between optical source layer 505a and 505b) may be about 30 mm. In some aspects, the vertical distance 568 between successive optical source layers 505 may be about the same. In some aspect, the vertical distance 568 between successive optical source layers 505 may differ. It may be recognized that, if each photon source in the vertical array produces a total optical output of about 150 W to about 200 W, the combination of even 5 layers may result in a total optical output of about 750 W to about 1000 W, thereby increasing the overall optical output of the array as a multiple of the number of optical source layers 505.

In some aspects, the vertical array 510 of individual optical source layers 505 may include a plurality of equally spaced optical source layers 505. In some aspects, any two adjacent optical source layers 505 in the vertical array 510 may have a vertical distance 568 therebetween that may have a range of about 5 mm to about 30 mm. In some non-limiting examples, the vertical distance 568 between adjacent optical source layers 505 may be about 5 mm, about 10 mm, about 15 mm, about 20 mm, about 25 mm, about 30 mm, or any value or range of values therebetween including endpoints.

FIG. 6A depicts yet another aspect of a photon source 600. Returning to FIGS. 2 and 3A,B, it may be recognized that a horizontal spacing between optical emitters 240 may be limited by the size of the slow-axis collimating (SLC) lenses 204. If the output light from the laser diodes 201 can be rotated by 90°, the slow-axis collimating lenses 204 can also be rotated so that their longitudinal extent on the substrate 220 can be minimized. FIG. 6A illustrates a method of rotating laser light by means of a beam twister 645. As an example, FIG. 6A depicts 18 optical emitters 640 with their associated slow-axis collimating lens 604 and beam twister 645. The beam twister 645 may be disposed between the fast-axis collimating lens of an optical emitter 640 including a laser diode (such as 201) and the fast-axis collimating lens (such as 202), and the slow-axis collimating lens 604 and may rotate the light exiting the fast-axis collimating lens (such as 202) by any angle, for example by 90°. Non-limiting examples of such an angle of light rotation may include about 15°, about 30°, about 45°, about 60°, about 75°, about 90°, or any value or range of values therbetween including endpoints. As depicted in FIG. 6B, the rotated slow-axis collimating lenses 604 may be packed in a tighter ring than may be attainable for un-rotated slow-axis collimating lenses (see FIGS. 2 and 3A,B). Comparing FIG. 6B with FIG. 2, one may observe that the slow-axis collimating lenses 604 can be packed tighter together, and thus the ring of mirrors disposed within the ring of slow-axis collimating lenses 604 may also have a smaller diameter than the ring of mirrors 242 depicted in the aspect of FIG. 2. In one aspect, the ring of mirrors may be compacted to form the sides of a single monolithic polygonal pyramidal mirror 660 in which each side of the pyramidal mirror 660 comprises a reflecting mirror surface. The monolithic polygonal pyramidal mirror 660 of reflecting surfaces may be fabricated in a mold or may be readily cut from a blank made from a suitable material. It may be recognized that a single monolithic polygonal pyramidal mirror 660 may substitute for the ring of mirrors 242 in photon source 200 or photon source 400.

It may be understood that photon source 600 may incorporate many of the features and/or characteristics of the photon sources previously disclosed (in some non-limiting examples, photon source 200, photon source 400, and photon source 500). Thus, photon source 600 may include a substrate having a circular or polygonal circumference. The number of optical sources may be the same or greater (due to the compact geometry of the rotated slow-axis collimators). The laser diodes of the optical emitters 640 may have similar characteristics as disclosed above with respect to the laser diodes 201 of the optical emitters 240 of FIG. 2. The fast-axis collimators may be similarly disposed with respect to the laser diodes as disclosed above, for example in FIGS. 3A,B. A photon source 600 lacking the monolithic polygonal pyramidal mirror 660 may also have a spaced region approximately placed in the center of the substrate. Such an example of photon source 600 may form one of a plurality of optical source layers as depicted in photon source 500. The shape, orientation, and optical axes associated with the mirrors of photon source 600 may have similar characteristics as those of the mirrors 242 or 542 of photon sources 200 or 500, respectively.

FIG. 7 depicts an example of a beam twister 745. The input view 700a of the beam twister 745 illustrates the divergence of laser light 773 exiting the fast-axis collimator 702 and impinging on an input side of the beam twister 745. The output view 700b of the beam twister 745 depicts the rotation of the laser light 775 emitted by the beam twister 745 and impinging on an input face of a slow-axis collimator 704. In one non-limiting example, the fast-axis collimator 702 may be characterized as being a plano-convex acylindrical lens having an effective focal length of about 0.5 mm. Similarly, in one non-limiting example, the slow-axis collimator 704 may be characterized as being a plana-convex acylindrical lens having an effective focal length of about 25.0 mm. It may be understood that the geometry and optical properties of the fast-axis collimator 702 and slow-axis collimator 704 may be chosen according to the geometric and optical properties desired for the photon source. It may also be understood that such characteristics of fast-axis collimator 702 and slow-axis collimator 704 may characterize fast-axis collimator 202 and slow-axis collimator 204 as depicted in FIGS. 2 and 3. Collimators having such characteristics may be used as required in photon sources 200, 400, 500, and 600, as disclosed above. In some non-limiting examples, the beam twister 745 may be a symmetric bi-convex cylindrical lens rotated at about 45° with respect to the fast axis of the laser diode emitting the laser light. In some examples, the beam twister 745 may have a radius of curvature of about 0.68 mm and a length of about 3.00 mm. In some examples, the beam twister 745 may be fabricated of N-LASF9 glass.

Figure 8:
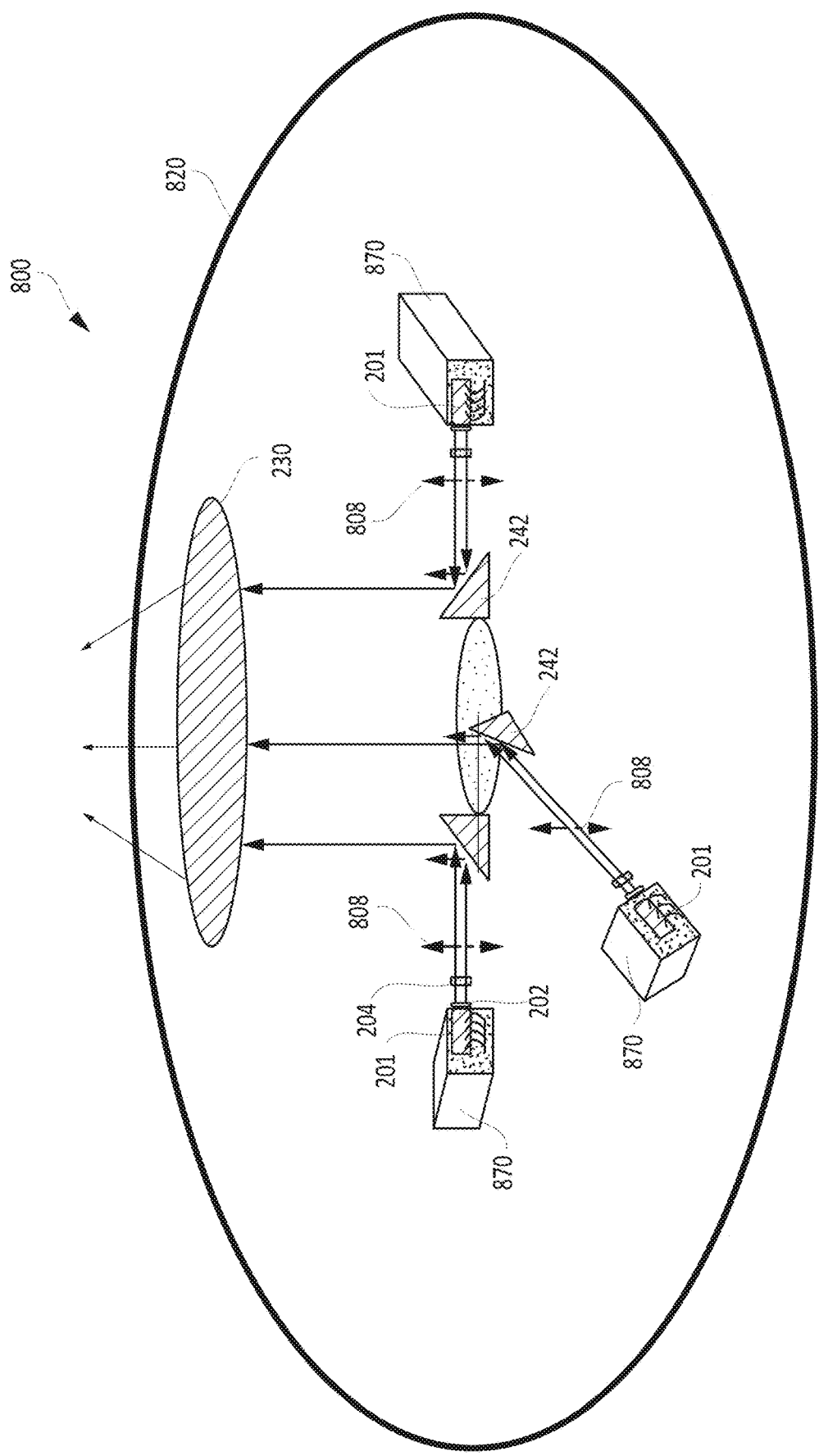
FIG. 8 is an illustration of a fifth aspect of a laser photon source having optical emitters disposed orthogonal to the disposition of the emitters depicted in the first aspect of a laser photon source as depicted in FIG. 2, according to one aspect of the present disclosure.

FIG. 8 illustrates an alternative example of a photon source 800, in which the laser diodes are rotated with respect to the surface of the substrate 820. It may be recognized that the fast-axis collimating lens 202 associated with each of the laser diodes 201 may also be similarly rotated. In such an example, beam twisters would not be required as the optical output of the laser diodes 201 is initially rotated with respect to the surface of the substrate 820. In some non-limiting examples, a laser diode 201 may be mounted on a heat sink 870 so that a plane of the fast-axis 808 of the laser diode 201 may be orthogonal to the plane of the substrate 820. In some non-limiting examples, the heat sink 870 may be formed as a tab derived from a portion of the substrate 202 that is bent at an appropriate angle. In some alternative aspects, the heat sink 870 may be formed as a block of a thermally conductive material of any shape or size that may be placed in thermal communication with the substrate 820. In some additional aspects, the heat sink 870 may include features such as fins that may improve the heat dissipation from the laser diode 201. In some additional examples, the heat sink 870 may be in thermal communication with the substrate 820 so that heat generated by the laser diode 201 may be dissipated into the substrate 820. It may be understood that the disposition of the laser diode 201 directly on the substrate 220 (see FIG. 2) may similarly allow heat generated by the laser diode 201 to be dissipated by the substrate 220.

One advantage of the photon source 800 depicted in FIG. 8 is that it removes the sensitivity of alignment of the beam twister required for proper functioning. As the photon source 800 may not require the addition of any beam twisters, the overall cost of the photon source 800 is reduced compared to the photon source 700. Chip-to-chip electrical connectivity between laser diodes 201 may differ from that which may be required in the aspects depicted, for example, in FIG. 2, but may be a useful trade-off of optical issues with mechanical electrical matters.

It may be recognized that the components of the aspects of the photon sources 600 and 800, as depicted in FIGS. 6A and 8 respectively, may include any or all of the characteristics of the photon source depicted in FIG. 2, including, but not limited to, the disposition and number of the mirrors 242 and their angles with respect to the substrate surface. The optical emitters, comprising the laser diodes 201, fast-axis collimating lenses 202 and slow-axis collimating lenses 204 of photon source 800 may have the optical characteristics of those disclosed with respect to photon source 200. Additionally, the geometrical disposition of the optical emitters and optical sources about the mirrors 242 on the substrate surface may include similar characteristics as those disclosed, for example, with respect to photon source 200. Laser light emitted from each of the optical emitters may be focused on the mirrors 242, and the light maybe be reflected through a focus lens 230 to be received by an optical fiber. Further, the characteristics, including geometric characteristics, of substrate 820 may be the same as previously disclosed with respect to substrate 220 (see FIG. 2), for example. Additionally, the number and disposition of optical sources (including, without limitation, mirrors, and optical emitters) disclosed with respect to photon source 800 may be the same as those disclosed with respect to photon source 200. A plurality of photon sources 800 may be disposed in a vertical array, similar to the optical source layers 505 as depicted in FIGS. 5A,B. Rotated laser diodes, along with their related optical components and heat sinks, may be used in the dual-ring configuration of photon source 400.

Figure 9:
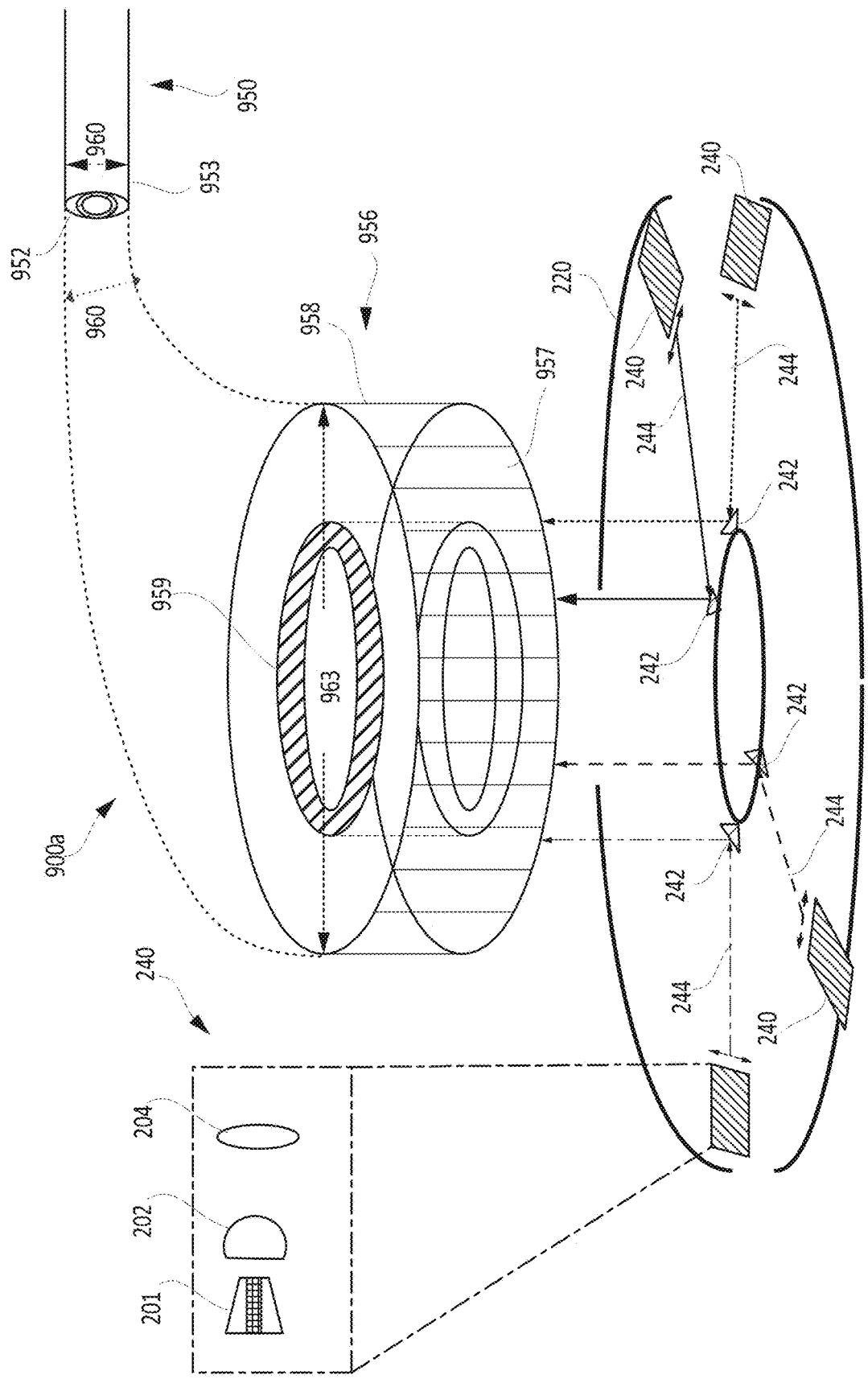
FIG. 9 is an illustration of a sixth aspect of a laser photon source, according to one aspect of the present disclosure.
Figure 10A:
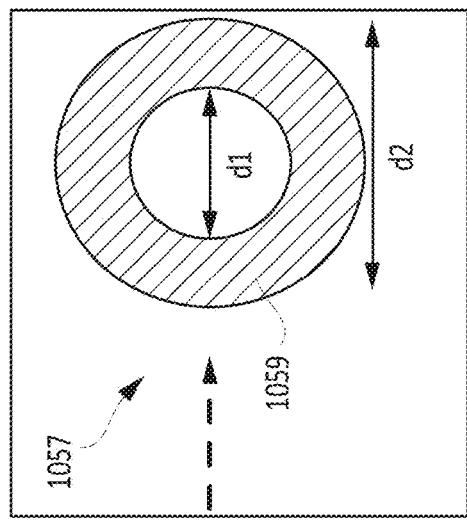
FIG. 10A is an end view of an optical shell component of the seventh aspect of a laser photon source, according to one aspect of the present disclosure
Figure 10:
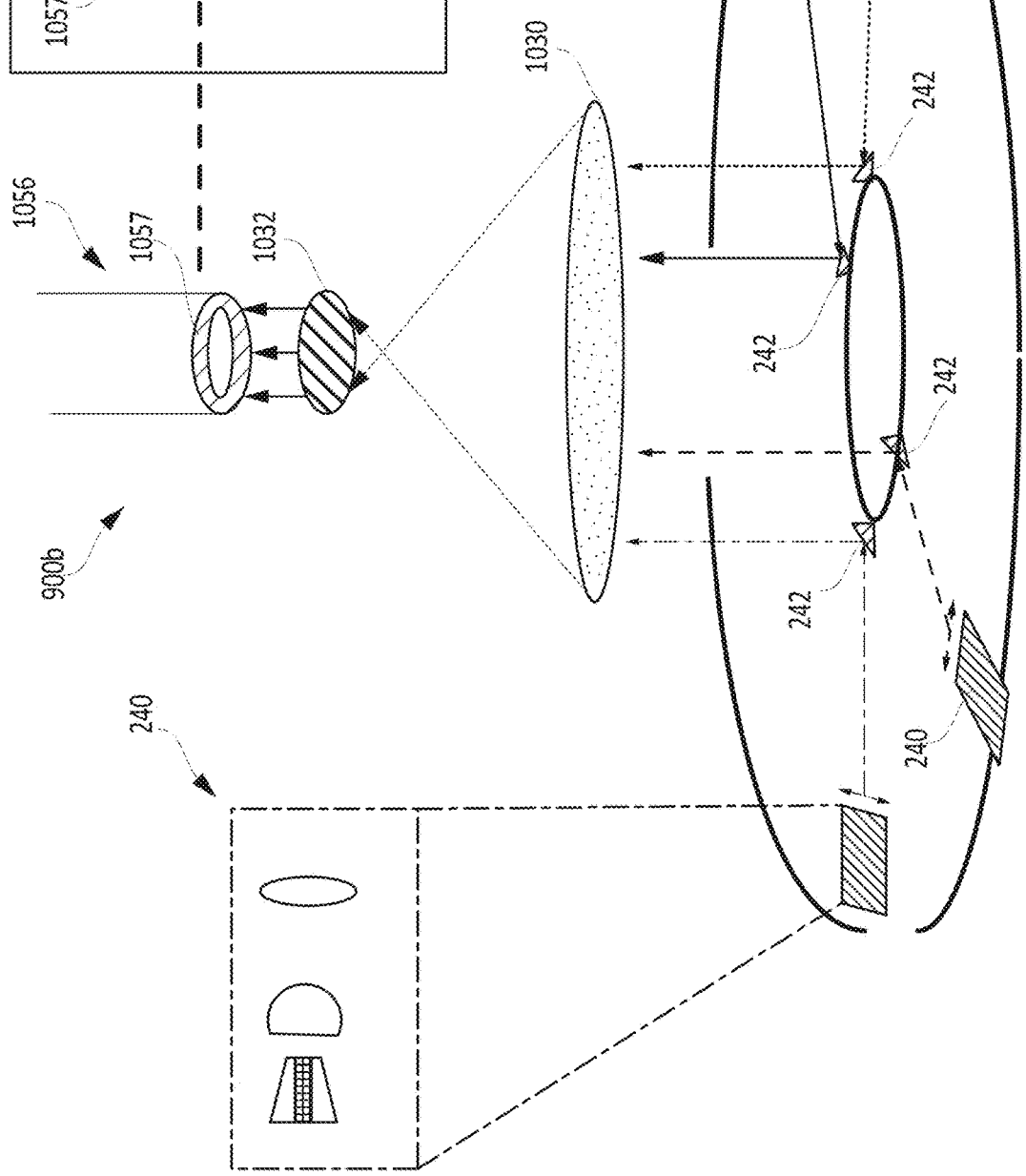
FIG. 10 is an illustration of a seventh aspect of a laser photon source, according to one aspect of the present disclosure.

FIGS. 9 and 10 depict yet another aspect of a photon source 900a,b, respectively. The photon source depicted in FIGS. 9 and 10 may include the substrate, the optical source, and mirrors as disclosed above with respect to FIGS. 2 and 4.

Thus, in some aspects, the laser photon source 900 may include a substrate 220 defining a planar surface on which may be disposed a plurality of optical sources. Each optical source may include a mirror 242 disposed on the substrate 220 having a reflecting surface defining a first predetermined angle relative to the planar surface of the substrate 220. Each mirror 242 reflecting surface may be configured to reflect a collimated optical beam incident on the reflecting surface away from the planar surface of the substrate 220 at a second predetermined angle relative to the planar surface of the substrate 220. Further, a plurality of mirrors may be defined as a combination of each mirror 242 of the plurality of optical sources, and the plurality of mirrors may be arranged in a first ring-like configuration. Each optical source may also include an optical emitter 240 disposed on the substrate 220 in which the optical emitter 240 is optically aligned with the mirror 242 along an optical axis 244 and configured to emit the collimated optical beam along the optical axis 244, Further, a plurality of optical emitters may be defined as a collection of each optical emitter 240 of the plurality of optical sources, and the plurality of optical emitters may be arranged in a second ring-like configuration.

Each optical emitter 240 may include a first collimating lens 202 optically aligned with a laser diode 201, in which the first collimating lens 202 (a fast-axis lens) is configured to collimate the optical beam emitted from the laser diode 201 along the fast-axis. A second collimating lens 204 (a slow-axis lens) may be optically aligned with the fast-axis lens 202 and the output facet (110, see FIGS. 1A,B) in which the slow-axis lens 204 is configured to collimate the optical beam emitted from the fast-axis lens 202 along the slow-axis of the laser diode 201.

Other features of the substrate 220 and optical sources previously disclosed with respect to photon source 200 may similarly apply to photon source 900.

As depicted in FIGS. 9 and 10, the outputs of the reflecting mirrors 242 of photon source 900a,b, respectively, are directed to an annular base surface 957 of an optical shell 956. In some aspects, the diameter 963 of the annular base surface 957 may be about the same as the diameter of the ring of mirrors 242 disposed on the substrate 220, In some aspects, the optical shell 956 may take the form of a fully or partially hollow frustum. In some aspects, the partially hollow frustum may have a top surface that is an annular surface having an outer diameter 960 that is smaller than the outer diameter 963 of the annular base surface 957. In some alternative examples, the top surface of the frustum may be circular, having no annulus. The frustum may have a taper and the taper may be an adiabatic taper. It may be recognized that an adiabatic taper may be one in which light transmitted through the walls of the partially hollow frustum is contained within the walls of the frustum and is not emitted from the sides of the frustum (so that no light energy is lost).

In some aspects, the optical shell 956 may include an outer cladding 958 that may surround an optically conducting medium 959. The optically conducting medium 959 may be hollow throughout the length of the optical shell 956 or it may taper to a complete flat surface having no annulus at the top surface of the frustum.

The top surface of the optical shell 956 may have a diameter 960 of an optical fiber 950. In some aspects, light emitted from the top surface of the optical shell 956 may be directed towards a receiving surface of an optical coupler. The transmitting surface of the optical coupler may direct light onto an end surface of an optical fiber core 952 of an optical fiber 950. The optical fiber 950 may also include an external cladding 953.

Although the optical shell 956 may be formed as a frustum (a section of a right circular cone), it may be recognized that the optical shell 956 may take on any of a variety of shapes consistent with its function. For example, as depicted in FIG. 9, the optical shell 956 may take the form of a bent frustum in which the central axis of the frustum is not a line but a curve, although the base of the central axis may be orthogonal to the surface of the substrate 220.

In the aspect 900a depicted in FIG. 9, the light reflected by the mirrors 242 is directly focused on the annular base surface 957 of the optical shell 956, thereby requiring no focusing lens. In the aspect 900b depicted in FIG. 10, the light reflected by the mirrors 242 is directed to a system of one or more focusing lenses 1030,1032 which focus the light on the annular base surface 1057 of the optical shell 1056. In some aspects, the system of one or more focusing lenses 1030, 1032 may constitute any one or more, or combination of, collimating lenses and focusing lenses. In some examples, the system of one or more focusing lenses 1030, 1032 may produce a de-magnified image of the multiplicity of diode sources on the annular base surface 1057 of the optically conducting medium of the optical shell 1056. It may be recognized that the optical shell 1056 of the photon source 900b having a system of one or more focusing lenses 1030, 1032, may have a smaller taper than the optical shell 956 depicted in the photon source 900a illustrated in FIG. 9 (which lacks such a system of focusing lenses). In some aspects, the smaller taper may be easier to manufacture. In some other non-limiting aspects, the optical shell 1056 may lack the cladding layer 958 depicted with respect to photon source 900a. Such an optical shell 1056 may be characterized as being a capillary optical shell, which may incorporate a taper. In some aspects, the capillary optical shell 1056 may lack a taper and may be characterized as a cylindrical fiber capillary.

FIG. 10A depicts an end view of the optical shell annular base surface 1057 on which the reflected light may be focused. It may be recognized that the laser light from the plurality of optical emitters 240 may be focused on the optically conducting medium 1059 of the optical shell annular base surface 1057. In some aspects, the optical shell 1056 may be tapered to a solid rod fiber (by collapsing the center hole). In some aspects, the optical shell annular base surface 1057 may be characterized by an inner diameter d1 and an outer diameter d2.

Figure 11:
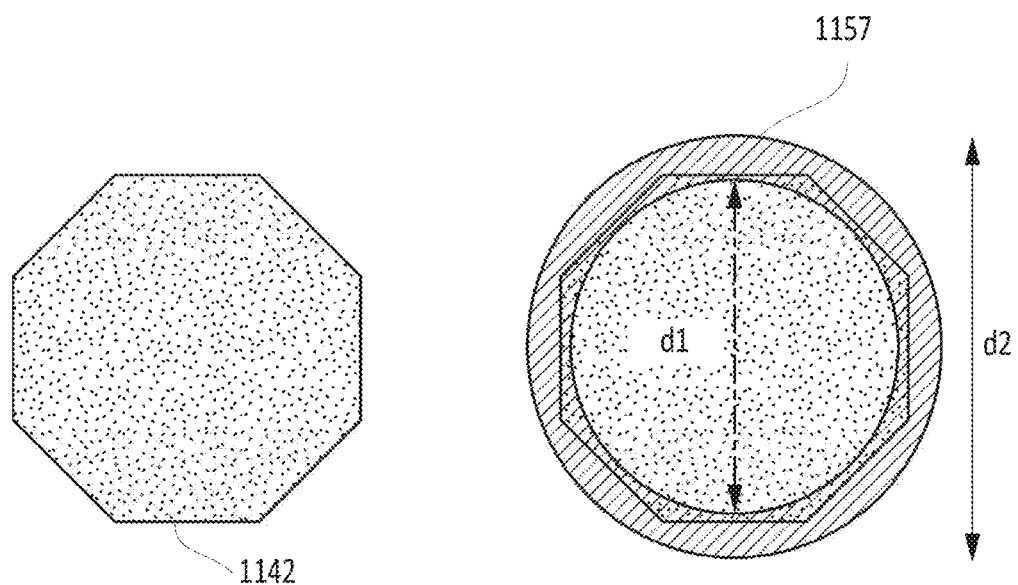
FIG. 11 illustrates schematically the positioning of an optical shell as depicted in FIG. 9 above a plurality of reflecting mirrors, according to one aspect of the present disclosure.

FIG. 11 depicts an example of the placement of the annular base surface 1157 of the optical shell with respect to the ring of reflecting mirrors 1142 for photon source 900b. It may be understood that the values disclosed herein are examples only, and that a photon source 900b may be fabricated to include any number of mirrors and lenses, for example. The following disclosure presents some sample calculations for the photon source 900b. In these calculations, the variable Bpp corresponds to a beam parameter product defined as the beam width (in mm) multiplied by the beam full divergence (in radians).

In one example, the slow-axis Bpp of the beam at the mirror surface may be about 7 mm-mrad and the fast-axis Bpp of the beam at the mirror surface may be about 0.3 mm-mrad, assuming that the Bpp is invariant. In this example, the beam size on the mirrors 1142 may be <2 mm, so a mirror having a length of about 2 mm will not lose any light. Such exemplary values may be possible if, after collimation by the slow-axis collimator/fast-axis collimator lenses, the distance from an optical emitter to a mirror 1142 is kept small based on the optical geometry of the slow-axis collimator lens and the fast-axis collimator lens. In the present example, the reflecting mirrors 1142 may form an octagon having a length of about 2 mm on each side. Such a geometry may be useful for a photon source composed of 8 emitters. It may be recognized that a photon source having N optical emitters will have N mirrors 1142. The effective diameter of this octagonal array of mirrors 1142 may be about 5 mm. Therefore, the slow axis beam may have a half-width equal to about 1 mm and a half-angle equal to about 7 mrad. Similarly, the fast-axis beam may have a half-width equal to about 0.2 mm and a half-angle equal to about 1.5 mrad. The optical shell 1056 may be disposed above the ring of mirrors 1142 and the annular base surface 1157 of the optical shell 1056 may have dimensions of an outer diameter d2 equal to about 5 mm and an inner diameter d1 equal to about 4.6 mm, for an optical shell 1056 having a fiber wall thickness of about 0.2 mm at the annular base surface 1157. The numerical aperture of light entering the optical shell 1056 (for example, an optical shell having the shape of a capillary tube) is therefore about 7 mrad (slow-axis) and about 1.5 mrad (fast-axis). If the optical shell 1056 is tapered by about a factor of 20, the outer diameter at the tapered end may be about 250 µm and the inner diameter at the tapered end may be about 230 µm. Thus, at the tapered end of the optical shell 1056, the slow-axis numerical apertures may be about 20×7 mrad or about 140 mrad and the fast-axis numerical apertures may be about 20×1.5 mrad or about 30 mrad. The optical shell 1056, tapered to about a 250 µm outer diameter and a 230 µm inner diameter may be further collapsed adiabatically to form a solid core having a total diameter of about 98 µm. Because the optically conducting surface area is not changed, the numerical apertures should remain the same. As a result, the output light of 8 optical emitters may be contained in an optical core having a diameter of about 98 µm and a maximum numerical aperture of about 140 mrad (NA equals about 0.14). In some aspects, final numerical aperture (divergence) of the light may be lower since the capillary optical shell 1056 may homogenize the slow-axis/fast-axis to result in an effectively lower homogenized numerical aperture (theoretically almost by half) thus resulting in a brighter output beam.

Figure 12:
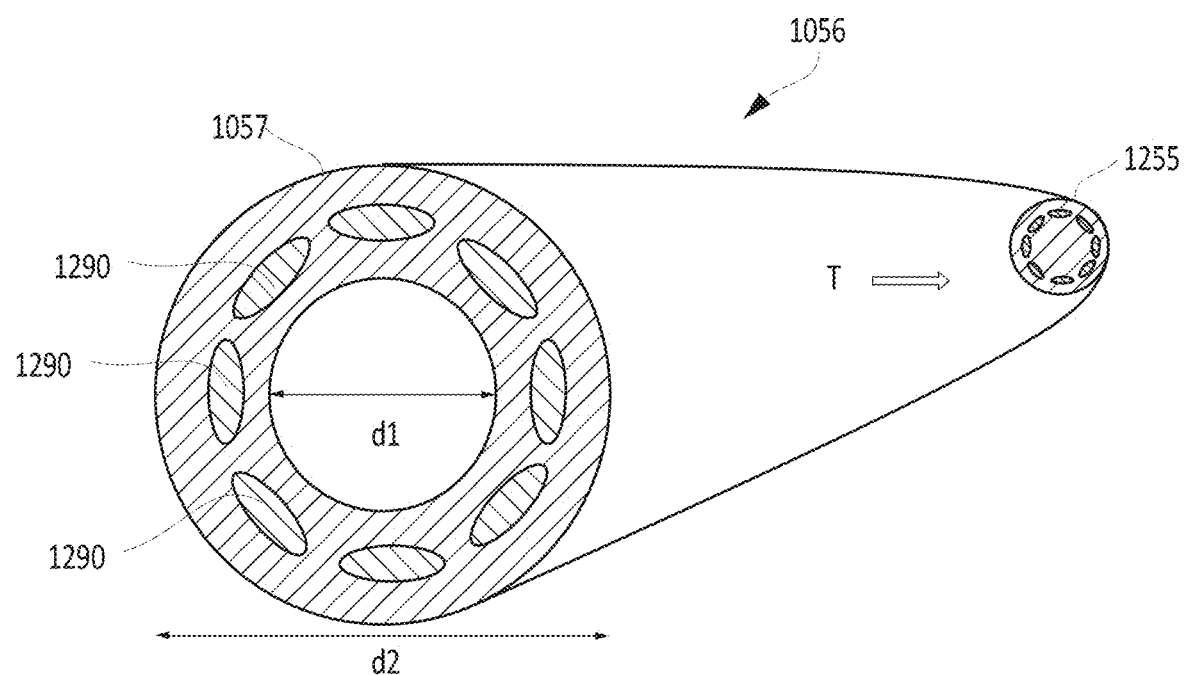
FIG. 12 illustrates schematically the taper of an optical shell of the aspect of the laser photon source as depicted in FIG. 9, according to one aspect of the present disclosure.

FIG. 12 depicts a capillary optical shell 1056 which may be used in a photon source 900*b*. The capillary optical shell 1056 may be tapered (arrow T) from the annular base surface 1057 to a circular top surface 1255. As depicted in FIG. 12, the light from each of a plurality of optical emitters may be imaged 1290 on the optically conducting area of the annular base surface 1057. In one example, the optical shell 1056 may be fabricated of pure silica. In one aspect, the capillary optical shell 1056 is adiabatically tapered so that the circular top surface 1255 has a surface area that may be about equal to the surface area of the optically conducting medium of the capillary walls at the annular base surface 1057. For example, the optically conducting area at the annular base surface 1057 may be about $\pi/4$ $(d2^2-d1^2)$, which for some non-limiting examples, may have a value of about $135^2$ µm$^2$. The diameter of the circular top surface 1255 may therefore be about $(4/\pi)^{1/2}$ times 135 µm. The resulting numerical aperture of the fiber at the circular top surface 1255 (after adiabatic taper) may be about 0.15. It may be understood that the numerical aperture of the light coupled into the fiber (1290), may be limited to a maximum value of about 0.15. However, a somewhat higher numerical aperture may be tolerated in the slow-axis direction if the numerical aperture of the fast-axis is much lower. In this manner, the optical shell 1056 may act to homogenize the beam in the two different directions, so that the numerical aperture of the light emitted at the circular top surface 1255 may be uniformly less than or about equal to 0.15NA.

It may be possible to image 1290 the different optical emitters on the optical shell annular base surface 1057 at dimensions of about 200 µm to about 400 µm, in a ring like structure, ultimately tapering down to a solid core of 135 µm, and keeping the final numerical aperture to about 0.15. In one aspect, this may be done with a short focal length collimating lens (see 1032, FIG. 10) after the main focusing lens (1030, FIG. 10) although some demagnification relative to the main ring may be necessary.

Figure 13B:
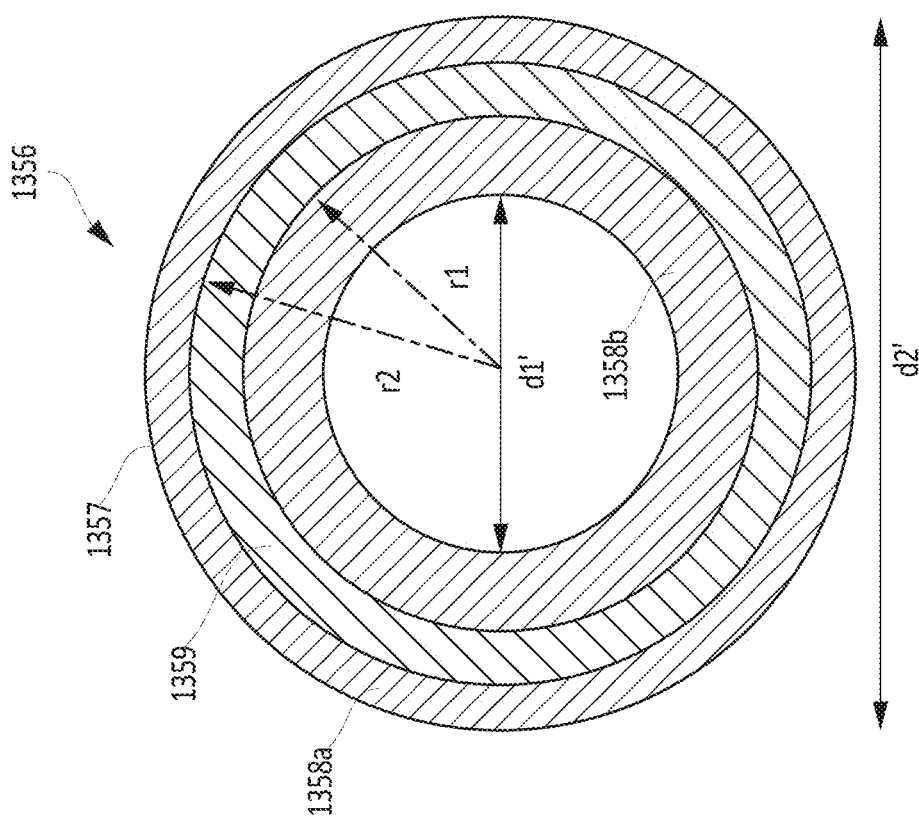
FIG. 13B illustrates schematically the base surface of an optical shell of the aspects of a laser photon source wherein the optical shell further comprises a cladding on an outer surface and at least part of an inner surface, according to one aspect of the present disclosure.
Figure 13A:
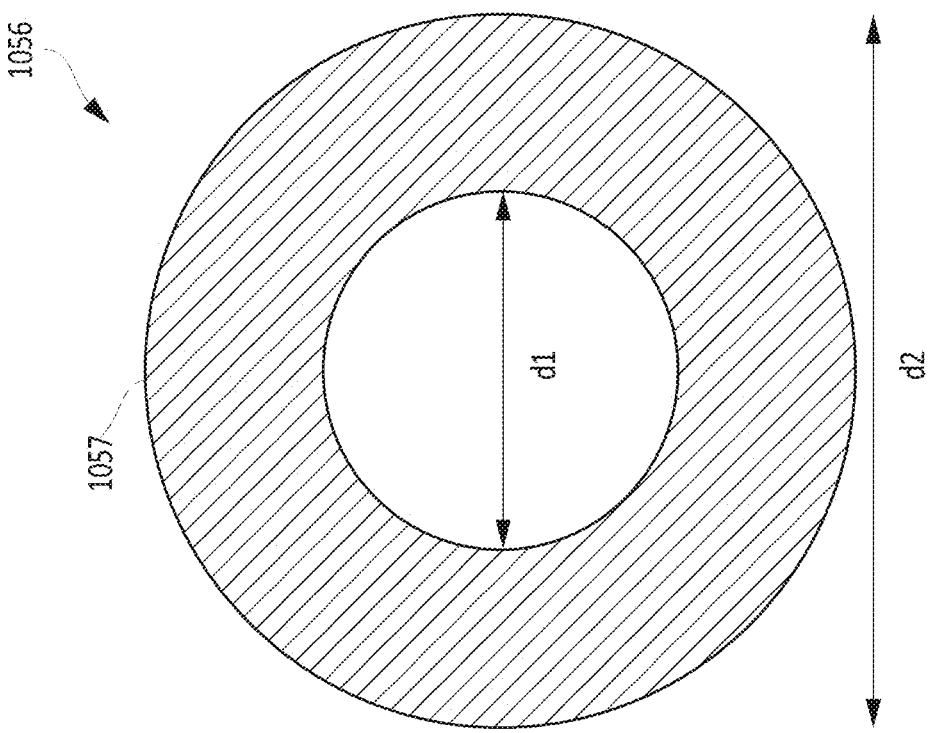
FIG. 13A illustrates schematically the base surface of an optical shell of the aspects of a laser photon source as depicted in FIG. 9 or FIG. 10, according to one aspect of the present disclosure.

FIG. 13A depicts the base annular surface 1057 of the aspect of the capillary optical shell 1056 having an inner diameter d1 as disclosed above with respect to photon source 900*b*. FIG. 13B illustrates another example of an optical shell 1356 that includes an outer surface cladding 1358*a* and an inner surface cladding 1358*b* that may surround the optically conducting medium 1359. The optical shell 1356 may have an outer diameter d2' and an inner diameter d1' at its base annular surface 1357. The optically conducting medium 1359 may have an annular cross-section characterized by an inner radius r1 and an outer radius r2 at the base annular surface 1357. Depending on the diode configuration of the photon source (for example, the number of laser diodes and their distributed over a given ring diameter), the correct geometry of the base annular surface 1357 of the optical shell 1356, including outer diameter d2', inner diameter d1', and radii r1 and r2 may be chosen to maximize the brightness of coupled light The design may be chosen to maintain the brightness of the "ring pattern" of the plurality of optical emitters, by accommodating for the hollow in the ring of mirrors by an appropriate hollow fiber design.

Figure 14:
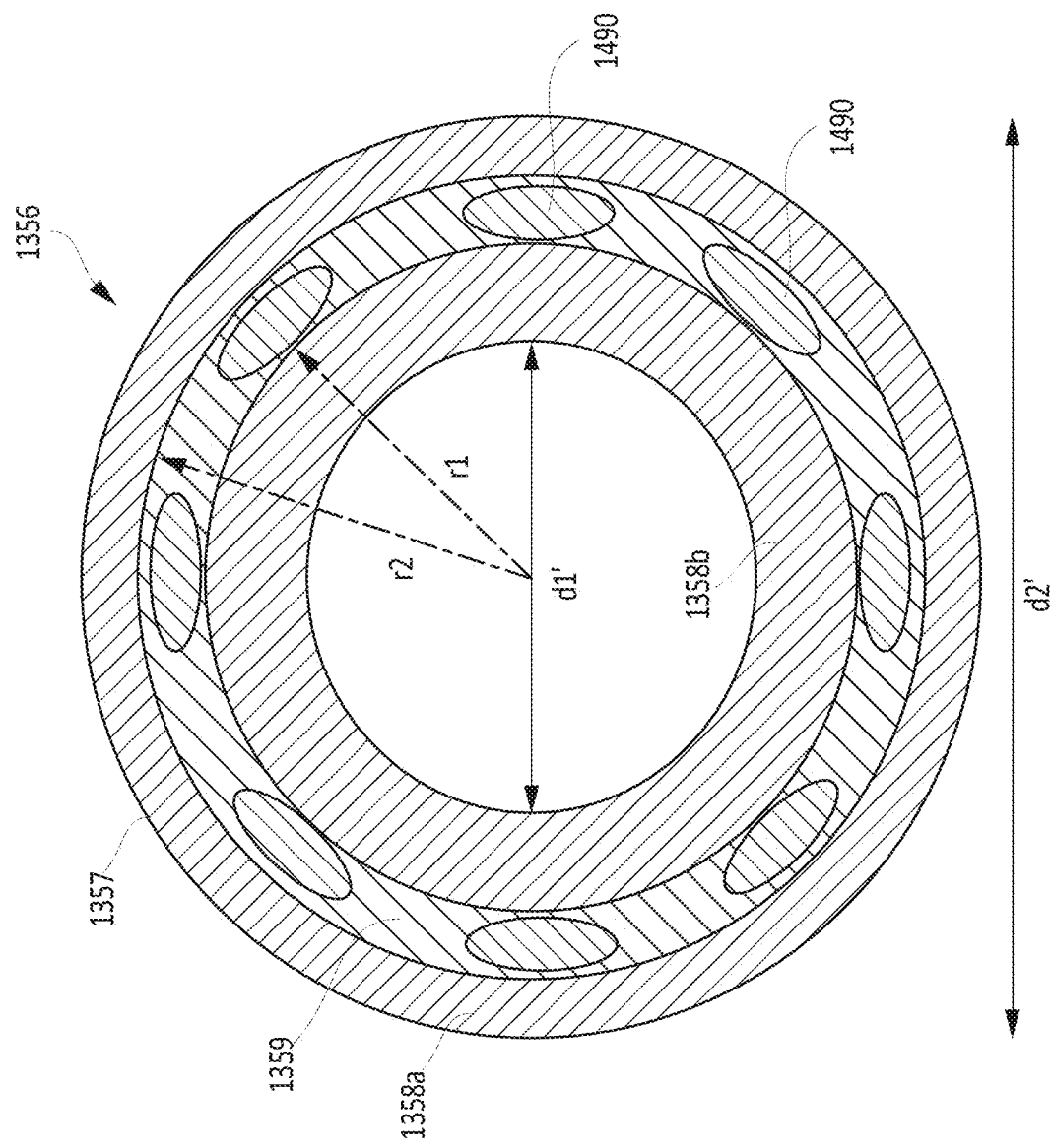
FIG. 14 illustrates schematically the focusing of the outputs of multiple optical emitters on a base surface of the optical shell depicted in FIG. 13B, according to one aspect of the present disclosure.

FIG. 14 illustrates the base annular surface 1357 of an optical shell 1356 having a cladding layer on its outer surface 1358*a* and a cladding layer on its inner surface 1358*b*, the cladding layers surrounding the optical conducting core 1359. As depicted in FIG. 13B, the optical conducting core 1359 may have an annular cross-section of its base annular surface 1357 characterized by an inner diameter r1 and an outer diameter r2. This design may provide an added degree of flexibility to adjust the numerical aperture of the shell that the light is coupled into. In practical terms, if a thin optical shell 1357 is required, this design may provide a better way to capture the light, and taper the structure down to required dimensions. The outer cladding 1358*a* and inner cladding 1358*b* may together act as a scaffold to the optical shell 1356 and support the optically conducting medium 1359 where the light travels. Handling and packaging of the cladded optical shell 1356 may be much easier than for a capillary optical shell (such as 1056, FIG. 10) lacking the cladding layers. For example, the outer diameter d2' may be fabricated to an arbitrary length because it would have no impact on the optical characteristics of the optical shell 1356. In one example the inner diameter and outer diameter of the optical shell 1356 at the tapered end may have values of about 135 µm and 155 µm, respectively. It may be recognized that the value of radius r1 may be close to the value of d1'/2 so that inner cladding layer 1358*b* may be very small at the tapered end of the optical shell 1356. Fabrication of a tapered and cladded optical shell 1356 may not be challenging. Further, high numerical aperture mode stripping would be easier with this design. In some examples, a cladded optical shell 1356 may have a numerical aperture of about 0.2.

The use of a tapered optical shell may result in a match spatially and 'angularly' as well, especially if the homogenization of the beam divergence occurs in the optical shell 1356 (without loss of brightness). To attain a better angular match at the optical shell annular base surface 1357 (between fast-axis 7 mrad vs. slow-axis 1.5 mrad), one may attempt to shrink the fast-axis dimension further to increase the divergence in this direction, and make the optical shell 1356 thinner if it appears that homogenization of the angular divergence is not taking place in the capillary.

Some additional applications may include using a focusing lens or an additional collimating lens to reduce the taper the optical shell by a large ratio. It may be recognized that an optical shell having a taper ratio of about 20 may be difficult to fabricate.

As depicted above in FIGS. 9 and 11 through 14, two optical shell designs may be considered for accepting light from the diodes. The first design corresponds to a capillary optical shell 1056 light guiding element as depicted in FIGS. 10, 10A, 11, 12, and 13A. The ring of diodes may be imaged 1490 on the base annular surface 1057 of the optical shell. In some non-limiting examples, the base annular surface 1057 may be coated with an anti-reflective coating. The capillary optical shell 1056 may be tapered adiabatically to a core diameter typically used to couple light directly from a multi-emitter diode configuration. In some non-limiting example, the core may have a diameter in the range of about 100 μm to about 200 μm. Non-limiting examples of a core may have a diameter of about 100 μm, about 110 μm, about 120 μm, about 130 μm, about 140 μm, about 150 μm, about 160 μm, about 170 μm, about 180 μm, about 190 μm, about 200 μm, or any value or range of values therebetween including endpoints. A second design corresponds to an optical shell design as depicted in FIG. 9, 13B, or 14 which may include one or more cladding layers applied either to an outer surface of an optical core, to an inner surface of an optical core, or to both outer surface and inner surface of the optical core. For example, optical shell 1356 includes an optically conducting medium 1359 disposed between an outer cladding layer 1358a and an inner cladding layer 1358b. The numerical aperture of the optically conducting medium 1359 (relative to the cladding layers 1358a,b) can take on values ranging from about 0.02 to about 1.0 depending on the degree of collimation of light from the diode sources. Non-limiting examples of the numerical aperture of the optically conducting medium 1359 may be about 0.02, about 0.05, about 0.1, about 0.2, about 0.5, about 1.0, or any value or range of values therebetween including endpoints. One can view this design as the more general design that approaches the capillary optical shell 1056 at the limit of r1=d1'/2 and r2/=d2'/2, This general design provides greater flexibility in light capturing abilities compared to the design of optical shell 1056.

It is further worth noting that either of these optical shell designs may have an optical (low loss) coating, with a specific numerical aperture to provide light guiding in the outermost glass shell and allow fiber handling and attachment capability without affecting the light guiding properties of the fiber (i.e. no light is lost due to fiber being attached to a package).

As depicted above in FIGS. 9 and 10, two additional configurations may be recognized, one with no focusing lens (photon source 900a, FIG. 9) and another with one or more focusing lenses (1030, 1032, FIG. 10). For photon sources including one or more focusing lenses 1030, 13032, the required dimensions of the annular base surface of the optical shell may be relatively small. In some non-limiting examples, the range of the diameters of the annular base surfaces may be from about 200 μm to about 400 μm. Further non-limiting examples of the diameters of the annular base surfaces may be about 200 μm, about 225 μm, about 250 μm, about 275 μm, about 300 μm, about 325 μm, about 350 μm, about 375 μm, about 400 μm, or any value of range of values therebetween including endpoints. For photon sources, such as photon source 900a, that do not include any focusing lenses, the dimensions of the annular base surface of the optical shell may be similar to the diameter of the ring of mirrors reflecting light from the diodes of a photon source, for example, about 5 mm. In both cases, the fiber would still have to be tapered down to dimensions such that the core diameter of the optical fiber is in the range of about 100 μm to about 200 μm. It may be recognized that it may be easier to manufacture an optical shell having a diameter that tapers down from a range of about 200 μm to about 400 μm, to a diameter of about 100 μm to about 200 μm, than to manufacture an optical shell having a diameter that tapers down from about 5 mm to a diameter of about 100 μm to about 200 μm.

In some aspects, an optical shell 956 or 1056 as depicted in FIGS. 9 and 10, respectively, may have the following characteristics:

A. Taper Characteristics, Exemplary Dimensions
1) Annular base surface: about 15 mm to about 3 mm;
2) Circular top surface: about 1 mm to about 100 μm;
3) Taper length: about 100 mm to about 5
4) Wall thickness at the annular base surface: about 3 mm to on the order of 10's of μm's.

B. Materials of Construction
1) Any one of a variety of high or low temperature optically transparent glasses, including, without limitation, fused pure or doped silica glasses, borosilicate glasses, phosphate glasses, flint glasses, Soda lime glasses, or ZBLAN glasses, which may have very limited absorption/scattering/loss in the laser diode emitted wavelengths of interest (which may range from about 0.3 μm to about 4.0 μm);
2) Crystalline optically transparent materials including, without limitation, sapphire or diamond, which may also be tapered and exhibit little or no absorption in the capillary over the laser diode emitted wavelengths of interest (which may range from about 0.3 μm to about 4.0 μm).

C. Annular Base Surface Construction:
1) In one aspect, the annular base surface of the capillary may be optically flat, fabricated using either cleaving or polishing techniques;
2) In another aspect, annular base surface of the capillary may be coated with an anti-reflective (AR) coating effective at the laser diode emitted wavelengths (which may range from about 0.3 μm to about 4.0 μm).

D. Coatings:
1) In one aspect, the capillary optical shell may have a first coating comprising any one or more of a variety of materials, which may include optically transparent low index polymeric coatings, for example a coating routinely used as a second cladding in double-clad optical fibers (typically fluoro-acrylate coatings having a numerical aperture relative to pure silica of about 0.5 or higher);
2) In one aspect, a secondary coating layer of higher modulus polymer may be disposed on top of the first coating to offer protection against mechanical damage;
3) In one aspect, the capillary optical shell may be coated with a high quality metal coating that may reflect the light at the glass metal interface, to minimize optical losses at this interface.

In some non-limiting aspects, an optical shell 1356 as depicted in FIG. 13B may have the following characteristics:

A. Taper Characteristics, Exemplary Dimensions:
1) Annular base surface: about 15 mm to about 3 mm;
2) Circular top surface: about 1 mm to about 100 μm;
3) Taper length: about 100 mm to about 5 mm;

4) Wall thickness at the annular base surface: about 3 mm to on the order of 10's of μm's;)
R1 (FIG. 13B): about 0.5 mm to about 50 μm;
6) R2 (FIG. 13B) about 7.5 mm to about 1.5 mm;
7) Numerical aperture of optical conducting medium (1359, FIG. 13B): about 0.05 to about 2.0.

B. Materials and Construction:
1) Any one of a variety of high or low temperature optically transparent glasses, including, without limitation, fused pure or doped silica glasses, borosilicate glasses, phosphate glasses, flint glasses, Soda lime glasses, or ZBLAN glasses, which may have very limited absorption/scattering/loss in the laser diode emitted wavelengths of interest (which may range from about 0.3 μm to about 4.0 μm);
2) The cladding material may be applied using MCVD (modified Chemical Vapor Deposition), PCVD (plasma chemical vapor deposition), by an outside vapor deposition processes, or with a double crucible method;
3) Crystalline optically transparent materials including, without limitation, sapphire or diamond, which may also be tapered and exhibit little or no absorption in the capillary over the laser diode emitted wavelengths of interest (which may range from about 0.3 μm to about 4.0 μm).

C. Annular Base Surface Construction:
1) In one aspect, the annular base surface of the capillary may be optically flat, fabricated using either cleaving or polishing techniques;
2) In another aspect, annular base surface of the capillary may be coated with an anti-reflective (AR) coating effective at the laser diode emitted wavelengths (which may range from about 0.3 μm to about 4.0 μm).

D. Coatings:
1) In one aspect, the capillary optical shell may have a first coating comprising any one or more of a variety of materials, which may include optically transparent low index polymeric coatings, for example a coating routinely used as a second cladding in double-clad optical fibers (typically fluoro-acrylate coatings having a numerical aperture relative to pure silica of about 0.5 or higher);
2) In one aspect, a secondary coating layer of higher modulus polymer may be disposed on top of the first coating to offer protection against mechanical damage;
3) In one aspect, the capillary may also be coated with high quality carbon or metal coating, which may act only as a protective element, since very little light should interact with it (due to the bulk of the light being guided in the optically conducting medium).

Figure 15B:
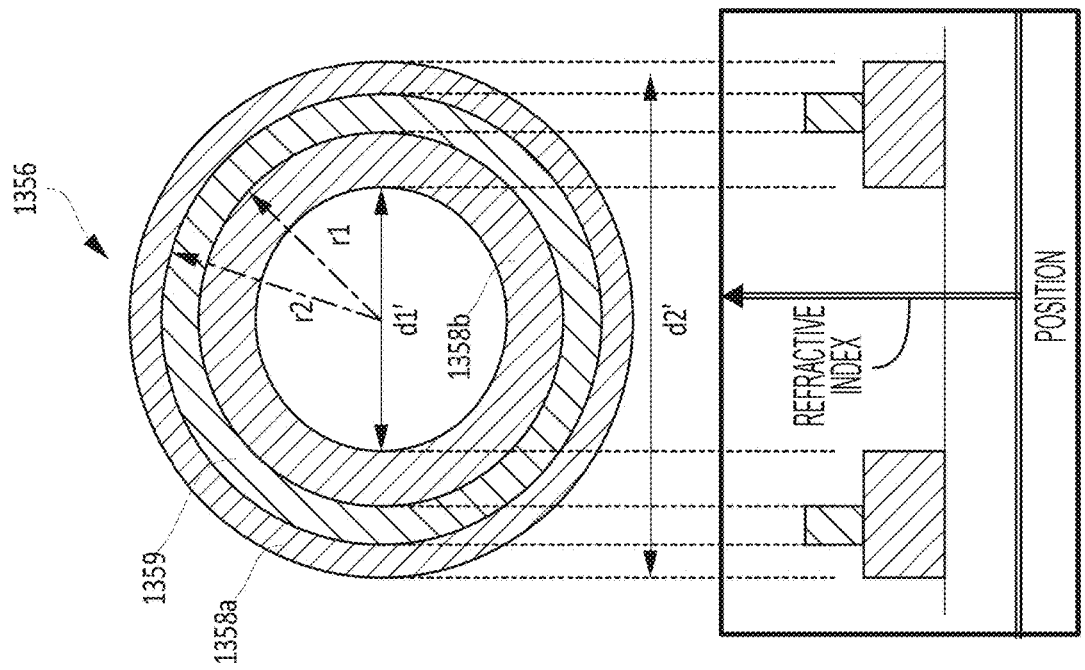
FIG. 15B illustrates schematically the refractive index of the optical shell depicted in FIG. 13B, according to one aspect of the present disclosure.
Figure 15A:
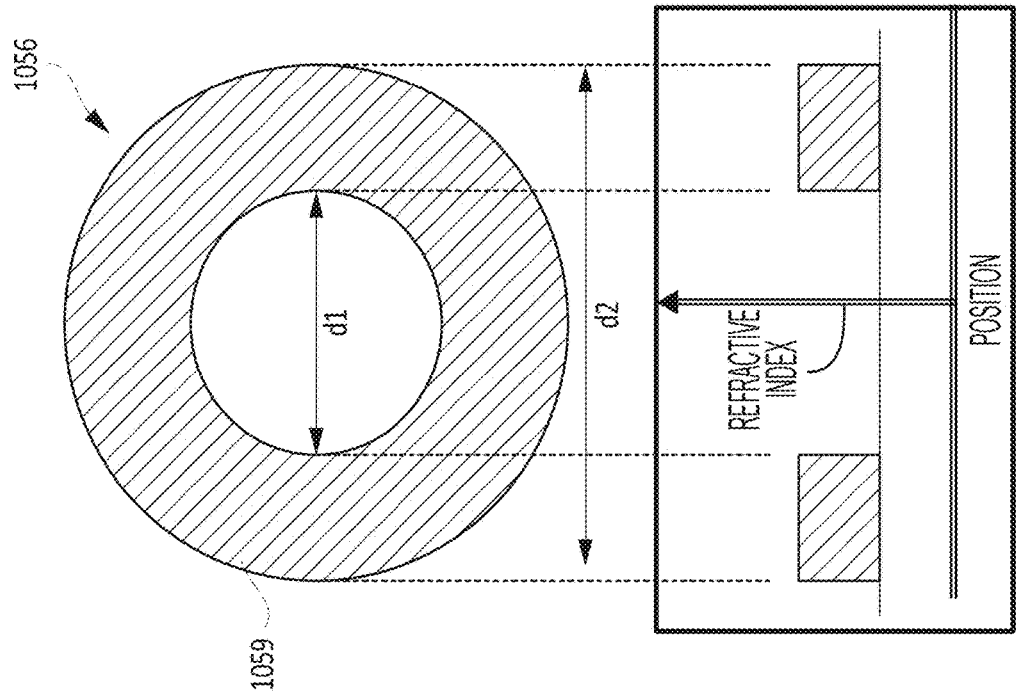
FIG. 15A illustrates schematically the refractive index of the optical shell depicted in FIG. 13A, according to one aspect of the present disclosure.

FIG. 15A depicts the relative refractive index (in cross-section) of an optical shell as depicted in FIG. 13A. FIG. 15B depicts the relative refractive index (in cross-section) of an optical shell as depicted in FIG. 13B particularly indicating the difference in refractive index of the optical receiving material compared to the surface cladding.

It may be recognized any of the optical shells disclosed above (see, for example, 956 in FIG. 9, 1056 in FIGS. 10, 10A, 11, 12, and 13A, and 1356 in FIGS. 13B and 14) may be used in conjunction with any of the photon sources 200, 400, 500, 600, or 800 as previously disclosed.

Figure 16:
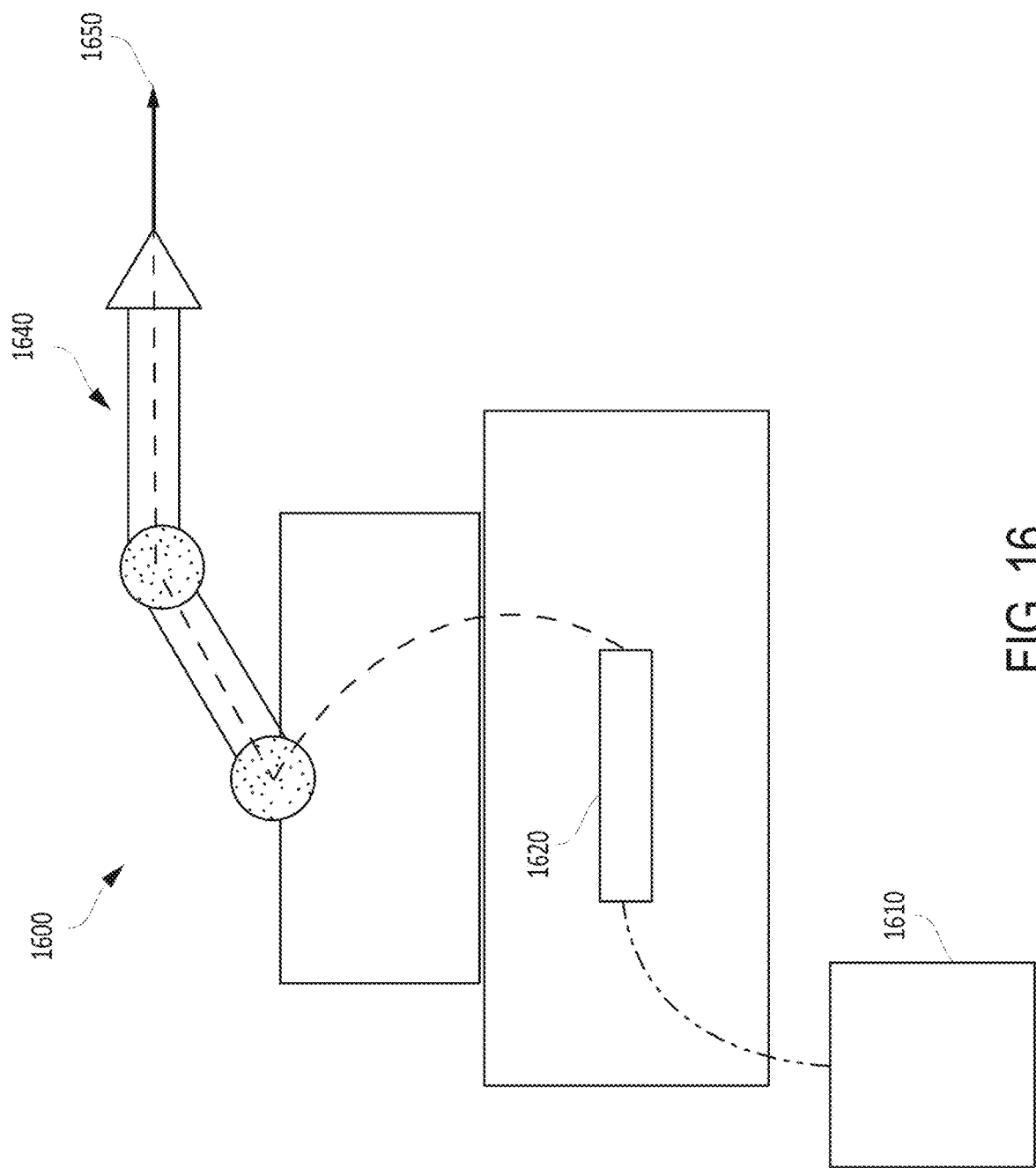
FIG. 16 illustrates schematically an automated laser cutting or welding device in which the working laser uses the laser photon source as a laser pump, according to one aspect of the present disclosure.
Figure 17:
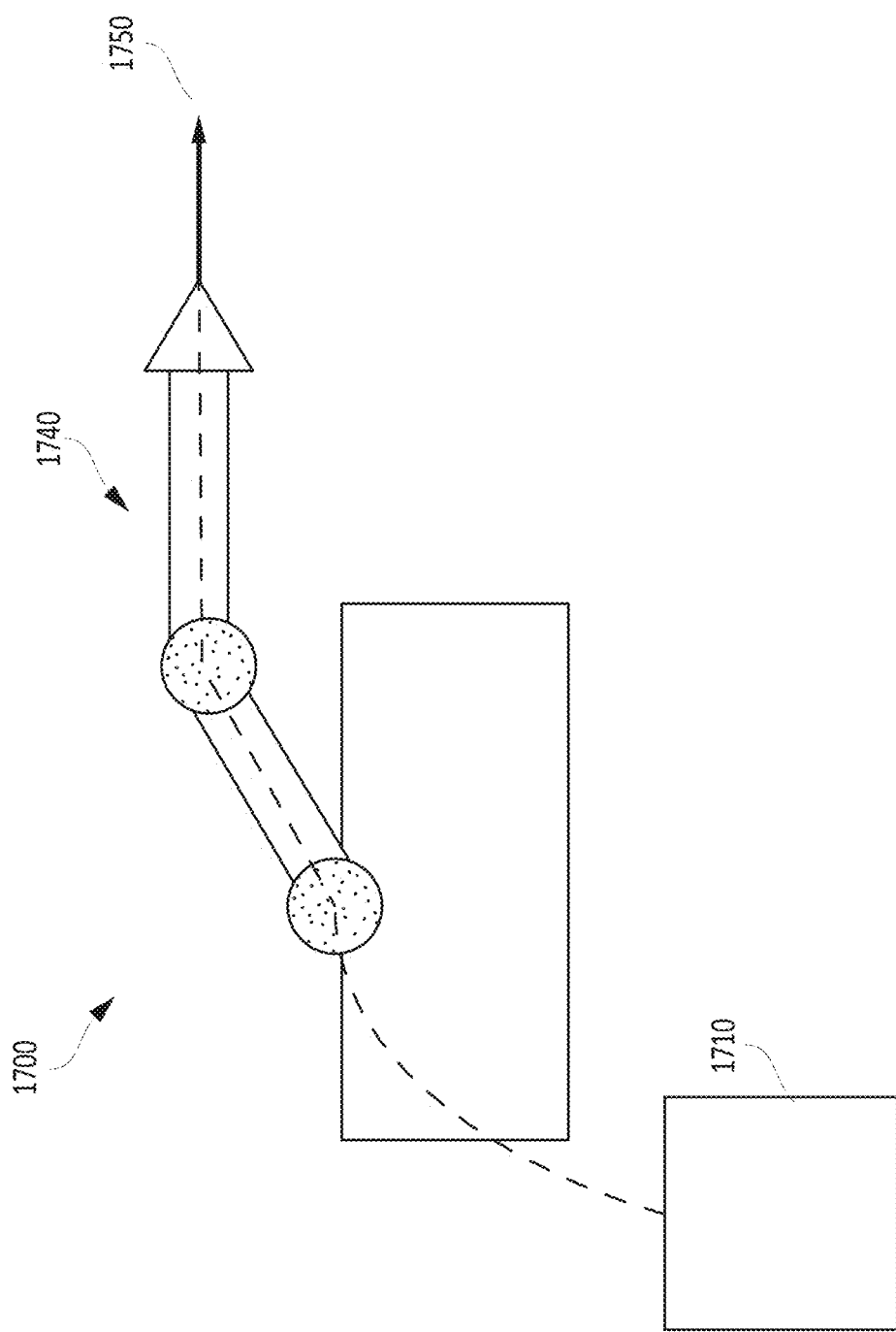
FIG. 17 illustrates schematically an automated laser cutting or welding device in which the laser photon source is the working laser, according to one aspect of the present disclosure.

FIGS. 16 and 17 depict schematically the use of the light generated by any of the aspects of a photon source as disclosed above in an automated (robotic) cutting or welding device. In FIG. 16, the output of the photon source may be used as the optical pump source for a working laser (for example a $CO_2$ gas laser or a Nd:YAG laser). In FIG. 16, the output of the photon source may be used directly as the working laser for the industrial application. In each case, the automated cutting device may include a movable arm to position the output laser beam with respect to a work surface.

In some aspects, the automated cutting or welding device may include actuator components configured to move one or more mechanical components of the automated cutting or welding device, for example, extendable arm components. The actuators may include, without limitation, electromechanical actuators (such as any type of motor), hydraulic actuators, and pneumatic actuators. The actuators may also incorporate any one or more auxiliary components such as gears, hoses, and valves, as may be required to effect any mechanical motion of the automated cutting device.

The automated cutting device may further include any electrical and/or electronic components to control any of the actuator components (including the auxiliary components). Such electrical and/or electronic components may include, without limitation, electronic motor control components and electronic valve actuator components, The automated cutting or welding device may further incorporate one or more sensor elements, configured to sense any one or more activities, mechanical positions, or other functional aspects of the cutting device or any of its mechanical components. Non-limiting examples of such sensors may include positional sensors (such as angular position sensors, and linear position sensors), velocity sensors (linear and rotational), limit switches, pressure sensors, and voltage and/or current sensors.

The automated cutting or welding device may include a control unit configured to direct the position of the movable arm as well as to control the output laser beam. The control unit may be actuated by an operator, or may include one or more automated control features. The control unit may comprise any number or type of automated control electronic hardware including one or more processors, memory units, electrical interfaces, along with one or more electrical bus structures to permit the exchange of data among and between the electronic hardware components. In some aspects, the electrical interfaces may receive data from any one or more of the sensor elements. In some other aspects, the electrical interfaces may transmit data to any one or more of the electrical and/or electronic components configured to control any of the actuator components. In some aspects, the memory units may include memory devices that may stored one or more instructions which, when executed by the processor, may result in the control of the actuators and/or the working laser light source.

Reference throughout the specification to "various aspects," "some aspects," "one example," or "one aspect" means that a particular feature, structure, or characteristic described in connection with the aspect is included in at least one example. Thus, appearances of the phrases "in various aspects," "in some aspects," "in one example," or "in one aspect" in places throughout the specification are not necessarily all referring to the same aspect. Furthermore, the particular features, structures, or characteristics illustrated or described in connection with one example may be combined, in whole or in part, with features, structures, or characteristics of one or more other aspects without limitation.

While various aspects herein have been illustrated by description of several aspects and while the illustrative embodiments have been described in considerable detail, it is not the intention of the applicant to restrict or in any way limit the scope of the appended claims to such detail. Additional advantages and modifications may readily appear to those skilled in the art.

It is to be understood that at least some of the figures and descriptions herein have been simplified to illustrate elements that are relevant for a clear understanding of the disclosure, while eliminating, for purposes of clarity, other elements. Those of ordinary skill in the art will recognize, however, that these and other elements may be desirable. However, because such elements are well known in the art, and because they do not facilitate a better understanding of the disclosure, a discussion of such elements is not provided herein.

While several aspects have been described, it should be apparent, however, that various modifications, alterations and adaptations to those embodiments may occur to persons skilled in the art with the attainment of some or all of the advantages of the disclosure. For example, according to various aspects, a single component may be replaced by multiple components, and multiple components may be replaced by a single component, to perform a given function or functions. This application is therefore intended to cover all such modifications, alterations and adaptations without departing from the scope and spirit of the disclosure as defined by the appended claims.

Any patent, publication, or other disclosure material, in whole or in part, that is said to be incorporated by reference herein is incorporated herein only to the extent that the incorporated materials does not conflict with existing definitions, statements, or other disclosure material set forth in this disclosure. As such, and to the extent necessary, the disclosure as explicitly set forth herein supersedes any conflicting material incorporated herein by reference. Any material, or portion thereof, that is said to be incorporated by reference herein, but which conflicts with existing definitions, statements, or other disclosure material set forth herein will only be incorporated to the extent that no conflict arises between that incorporated material and the existing disclosure material.

While various details have been set forth in the foregoing description, it will be appreciated that the various aspects of the techniques for operating a generator for digitally generating electrical signal waveforms and surgical instruments may be practiced without these specific details. One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken limiting.

Further, while several forms have been illustrated and described, it is not the intention of the applicant to restrict or limit the scope of the appended claims to such detail. Numerous modifications, variations, changes, substitutions, combinations, and equivalents to those forms may be implemented and will occur to those skilled in the art without departing from the scope of the present disclosure. Moreover, the structure of each element associated with the described forms can be alternatively described as a means for providing the function performed by the element. Also, where materials are disclosed for certain components, other materials may be used. It is therefore to be understood that the foregoing description and the appended claims are intended to cover all such modifications, combinations, and variations as falling within the scope of the disclosed forms. The appended claims are intended to cover all such modifications, variations, changes, substitutions, modifications, and equivalents.

For conciseness and clarity of disclosure, selected aspects of the foregoing disclosure have been shown in block diagram form rather than in detail. Some portions of the detailed descriptions provided herein may be presented in terms of instructions that operate on data that is stored in one or more computer memories or one or more data storage devices (e.g. floppy disk, hard disk drive, Compact Disc (CD), Digital Video Disk (DVD), or digital tape). Such descriptions and representations are used by those skilled in the art to describe and convey the substance of their work to others skilled in the art. In general, an algorithm refers to a self-consistent sequence of steps leading to a desired result, where a "step" refers to a manipulation of physical quantities and/or logic states which may, though need not necessarily, take the form of electrical or magnetic signals capable of being stored, transferred, combined, compared, and otherwise manipulated. It is common usage to refer to these signals as bits, values, elements, symbols, characters, terms, numbers, or the like. These and similar terms may be associated with the appropriate physical quantities and are merely convenient labels applied to these quantities and/or states.

Unless specifically stated otherwise as apparent from the foregoing disclosure, it is appreciated that, throughout the foregoing disclosure, discussions using terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

In a general sense, those skilled in the art will recognize that the various aspects described herein which can be implemented, individually and/or collectively, by a wide range of hardware, software, firmware, or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and/or electrical circuitry forming a communications device (e.g., a modem, communications switch, or optical-electrical equipment). Those having skill in the art will recognize that the subject matter described herein may be implemented in an analog or digital fashion or some combination thereof.

The foregoing detailed description has set forth various forms of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, and/or examples can be implemented, individually and/or collectively, by a wide range of hardware, software, firmware, or virtually any combination thereof. In one form, several portions of the subject matter described herein may be implemented via an application specific integrated circuits (ASIC), a field programmable gate array (FPGA), a digital signal processor (DSP), or other integrated formats. However, those skilled in the art will recognize that some aspects of the forms disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as one or more program products in a variety of forms, and that an illustrative form of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link (e.g., transmitter, receiver, transmission logic, reception logic, etc.), etc.).

In some instances, one or more elements may be described using the expression "coupled" and "connected" along with their derivatives. It should be understood that these terms are not intended as synonyms for each other. For example, some aspects may be described using the term "connected" to indicate that two or more elements are in direct physical or electrical contact with each other. In another example, some aspects may be described using the term "coupled" to indicate that two or more elements are in direct physical or electrical contact. The term "coupled," however, also may mean that two or more elements are not in direct contact with each other, but yet still co-operate or interact with each other. It is to be understood that depicted architectures of different components contained within, or connected with, different other components are merely examples, and that in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated also can be viewed as being "operably connected," or "operably coupled," to each other to achieve the desired functionality, and any two components capable of being so associated also can be viewed as being "operably couplable," to each other to achieve the desired functionality. Specific examples of operably couplable include but are not limited to physically mateable and/or physically interacting components, and/or wirelessly interactable, and/or wirelessly interacting components, and/ or logically interacting, and/or logically interactable components, and/or electrically interacting components, and/or electrically interactable components, and/or optically interacting components, and/or optically interactable components.

In other instances, one or more components may be referred to herein as "configured to," "configurable to," "operable/operative to," "adapted/adaptable," "able to," "conformable/conformed to," etc. Those skilled in the art will recognize that "configured to" can generally encompass active-state components and/or inactive-state components and/or standby-state components, unless context requires otherwise.

While particular aspects of the present disclosure have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true scope of the subject matter described herein. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to claims containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that typically a disjunctive word and/or phrase presenting two or more alternative terms, whether in the description, claims, or drawings, should be understood to contemplate the possibilities of including one of the terms, either of the terms, or both terms unless context dictates otherwise. For example, the phrase "A or B" will be typically understood to include the possibilities of "A" or "B" or "A and B."

With respect to the appended claims, those skilled in the art will appreciate that recited operations therein may generally be performed in any order. Also, although various operational flows are presented in a sequence(s), it should be understood that the various operations may be performed in other orders than those which are illustrated, or may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "related to," or other past-tense adjectives are generally not intended to exclude such variants, unless context dictates otherwise.

It is worthy to note that any reference to "one aspect," "an aspect," "one form," or "a form" means that a particular feature, structure, or characteristic described in connection with the aspect is included in at least one aspect. Thus, appearances of the phrases "in one aspect," "in an aspect," "in one form," or "in an form" in various places throughout the specification are not necessarily all referring to the same aspect. Furthermore, the particular features, structures or characteristics may be combined in any suitable manner in one or more aspects.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

In certain cases, use of a system or method may occur in a territory even if components are located outside the territory. For example, in a distributed computing context, use of a distributed computing system may occur in a territory even though parts of the system may be located outside of the territory (e.g., relay, server, processor, signal-bearing medium, transmitting computer, receiving computer, etc. located outside the territory).

A sale of a system or method may likewise occur in a territory even if components of the system or method are located and/or used outside the territory. Further, implementation of at least part of a system for performing a method in one territory does not preclude use of the system in another territory.

All of the above-mentioned U.S. patents, U.S. patent application publications, U.S. patent applications, foreign patents, foreign patent applications, non-patent publications referred to in this specification and/or listed in any Application Data Sheet, or any other disclosure material are incorporated herein by reference, to the extent not inconsistent herewith. As such, and to the extent necessary, the disclosure as explicitly set forth herein supersedes any conflicting material incorporated herein by reference. Any material, or portion thereof, that is said to be incorporated by reference herein, but which conflicts with existing definitions, statements, or other disclosure material set forth herein will only be incorporated to the extent that no conflict arises between that incorporated material and the existing disclosure material.

In summary, numerous benefits have been described which result from employing the concepts described herein. The foregoing description of the one or more forms has been presented for purposes of illustration and description. It is not intended to be exhaustive or limiting to the precise form disclosed. Modifications or variations are possible in light of the above teachings. The one or more forms were chosen and described in order to illustrate principles and practical application to thereby enable one of ordinary skill in the art to utilize the various forms and with various modifications as are suited to the particular use contemplated. It is intended that the claims submitted herewith define the overall scope.

Various aspects of the subject matter described herein are set out in the following numbered examples:

Example 1

A photon source comprising:
a substrate defining a planar surface;
a focus lens disposed above the planar surface, the focus lens defining an acceptance angle; and
a plurality of optical sources, wherein each optical source comprises:
  a mirror disposed on the substrate having a reflecting surface defining a first predetermined angle relative to the planar surface of the substrate, wherein the reflecting surface is configured to reflect a collimated optical beam incident on the reflecting surface away from the planar surface of the substrate at a second predetermined angle relative to the planar surface of the substrate; and
  an optical emitter comprising a beam twister and disposed on the substrate wherein the optical emitter is optically aligned with the mirror along an optical axis and configured to emit the collimated optical beam along the optical axis,
  wherein the mirror is configured to reflect the collimated optical beam within the acceptance angle of the focus lens;
wherein a plurality of mirrors comprises, collectively, each mirror of the plurality of optical sources, and the plurality of mirrors is arranged in a first ring-like configuration defining a first diameter, wherein the focus lens is disposed above the first ring-like configuration of the plurality of mirrors,
wherein a plurality of optical emitters comprises, collectively, each optical emitter of the plurality of optical sources, and the plurality of optical emitters is arranged in a second ring-like configuration defining a second diameter, and
wherein the first diameter is smaller than the second diameter and the second ring-like configuration is concentric with the first ring-like configuration.

Example 2

The photon source of Example 1, wherein the optical emitter of each of the plurality of optical sources comprises:
a laser diode configured to emit an optical beam from an output facet;

a first collimating lens optically aligned with the laser diode, wherein the first collimating lens is configured to collimate the optical beam emitted from the laser diode; and a second collimating lens optically aligned with the first collimating lens and the output facet, wherein the beam twister is disposed between and optically aligned with the first collimating lens and the second collimating lens and configured to receive an optical beam emitted by the first collimating lens, and wherein the second collimating lens is configured to collimate an optical beam emitted from the beam twister along the optical axis and transmit the collimated optical beam.

Example 3

The photon source of Example 2, wherein each laser diode is mounted on the substrate and the substrate is configured to dissipate heat generated by each laser diode when each laser diode receives electrical power.

Example 4

The photon source of any one or more of Examples 2 through 3, wherein each emitted optical beam emitted by each laser diode has a wavelength of 200 nm to 2000 nm.

Example 5

The photon source of any one or more of Examples 2 through 4, wherein the first collimating lens is a fast-axis collimating lens and the second collimating lens is a slow-axis collimating lens.

Example 6

The photon source of any one or more of Examples 2 through 5, wherein the beam twister is configured to rotate the optical beam emitted by the first collimating lens by a rotation angle.

Example 7

The photon source of Example 6, wherein the rotation angle has a range of 1 degree to 90 degrees.

Example 8

The photon source of Example 6, wherein the rotation angle has a range of 10 degree to 80 degrees.

Example 9

The photon source of Example 6, wherein the rotation angle has a range of 20 degree to 70 degrees.

Example 10

The photon source of Example 6, wherein the rotation angle has a range of 30 degree to 60 degrees.

Example 11

The photon source of Example 6, wherein the rotation angle is 45 degrees.

Example 12

The photon source of any one or more of Examples 1 through 11, wherein the plurality of optical sources is arranged symmetrically on the planar surface of the substrate.

Example 13

The photon source of Example 12, wherein the plurality of optical sources posses an N-fold rotational axis of symmetry orthogonal to the planar surface of the substrate, wherein N is an integer that ranges from 2 to 50.

Example 14

The photon source of any one or more of Examples 1 through 13, wherein the substrate defines a circular periphery.

Example 15

The photon source of claim any one or more of Examples 1 through 14, wherein the substrate defines a polygonal periphery comprising a plurality of sides.

Example 16

The photon source of Example 15, wherein the plurality of sides ranges from 2 to 50.

Example 17

The photon source of any one or more of Examples 15 through 16, wherein each optical emitter of the plurality of optical sources is disposed adjacent to one of the plurality of sides of the polygonal periphery.

Example 18

The photon source of any one or more of Examples 1 through 17, wherein the plurality of mirrors is cylindrically arranged.

Example 19

The photon source of any one or more of Examples 1 through 18, wherein the plurality of optical emitters is cylindrically arranged.

Example 20

The photon source of any one or more of Examples 1 through 19, further comprising an optical coupler configured to receive an optical output of the focus lens at a first coupler surface, and to receive an end of a fiber optic cable at a second coupler surface.

Example 21

A photon source comprising:
a substrate defining a planar surface;
a focus lens disposed above the planar surface, the focus lens defining an acceptance angle; and
a plurality of optical sources, wherein each optical source comprises:

a mirror having a reflecting surface defining a first predetermined angle relative to the planar surface of the substrate, wherein the reflecting surface is configured to reflect a collimated optical beam incident on the reflecting surface away from the planar surface of the substrate at a second predetermined angle relative to the planar surface of the substrate; and an optical emitter comprising a beam twister and disposed on the substrate wherein the optical emitter is optically aligned with the mirror along an optical axis and configured to emit the collimated optical beam along the optical axis, wherein the mirror is configured to reflect the collimated optical beam within the acceptance angle of the focus lens;

wherein each mirror of the plurality of optical sources comprises a side of a polygonal pyramid disposed on the planar surface of the substrate, the polygonal pyramid having a pyramidal axis and a base defining a first diameter, wherein the focus lens is disposed above the polygonal pyramid, wherein a plurality of optical emitters comprises, collectively, each optical emitter of the plurality of optical sources, and the plurality of optical emitters is arranged in a ring-like configuration defining a longitudinal ring axis orthogonal to the planar surface and a second diameter, and wherein the first diameter is smaller than the second diameter and the pyramidal axis is coaxial with the longitudinal ring axis.

Example 22

A photon source comprising:
a substrate defining a planar surface;
a focus lens disposed above the planar surface, the focus lens defining an acceptance angle; and
a plurality of optical sources, wherein each optical source comprises:
　a mirror disposed on the substrate having a reflecting surface defining a first predetermined angle relative to the planar surface of the substrate, wherein the reflecting surface is configured to reflect a collimated optical beam incident on the reflecting surface away from the planar surface of the substrate at a second predetermined angle relative to the planar surface of the substrate; and
　an optical emitter disposed on the substrate,
　wherein the optical emitter is optically aligned with the mirror along an optical axis and configured to emit the collimated optical beam along the optical axis,
　wherein the optical emitter comprises a laser diode configured to emit an optical beam from an output facet,
　wherein the laser diode is mounted on a sub-mount having a sub-mount plane orthogonal to the planar surface, and
　wherein the mirror is configured to reflect the collimated optical beam within the acceptance angle of the focus lens;
wherein a plurality of mirrors comprises, collectively, each mirror of the plurality of optical sources, and the plurality of mirrors is arranged in a first ring-like configuration defining a first diameter, wherein the focus lens is disposed above the first ring-like configuration of the plurality of mirrors,
wherein a plurality of optical emitters comprises, collectively, each optical emitter of the plurality of optical sources, and the plurality of optical emitters is arranged in a second ring-like configuration defining a second diameter, and wherein the first diameter is smaller than the second diameter and the second ring-like configuration is concentric with the first ring-like configuration.

Example 23

The photon source of any one or more of Examples 1 through 20, wherein the optical emitter of each of the plurality of optical sources further comprises:
a first collimating lens optically aligned with the laser diode, wherein the first collimating lens is configured to collimate the optical beam emitted from the laser diode; and
a second collimating lens optically aligned with the first collimating lens and the output facet, wherein the second collimating lens is configured to collimate an optical beam emitted from the first collimating lens along the optical axis and transmit the collimated optical beam.

Example 24

The photon source of Example 23, wherein the first collimating lens is a fast-axis collimating lens and the second collimating lens is a slow-axis collimating lens.

What is claimed is:
1. A photon source comprising:
a substrate defining a planar surface;
a focus lens disposed above the planar surface, the focus lens defining an acceptance angle; and
a plurality of optical sources, wherein each optical source comprises:
　a mirror disposed on the substrate having a reflecting surface defining a first predetermined angle relative to the planar surface of the substrate, wherein the reflecting surface is configured to reflect a collimated optical beam incident on the reflecting surface away from the planar surface of the substrate at a second predetermined angle relative to the planar surface of the substrate; and
　an optical emitter comprising a beam twister and disposed on the substrate wherein the optical emitter is optically aligned with the mirror along an optical axis and configured to emit the collimated optical beam along the optical axis,
　wherein the mirror is configured to reflect the collimated optical beam within the acceptance angle of the focus lens;
　wherein a plurality of mirrors comprises, collectively, each mirror of the plurality of optical sources, and the plurality of mirrors is arranged in a first ring-like configuration defining a first diameter, wherein the focus lens is disposed above the first ring-like configuration of the plurality of mirrors,
wherein a plurality of optical emitters comprises, collectively, each optical emitter of the plurality of optical sources, and the plurality of optical emitters is arranged in a second ring-like configuration defining a second diameter, and
wherein the first diameter is smaller than the second diameter and the second ring-like configuration is concentric with the first ring-like configuration.
2. The photon source of claim 1, wherein the optical emitter of each of the plurality of optical sources comprises:
a laser diode configured to emit an optical beam from an output facet;

a first collimating lens optically aligned with the laser diode, wherein the first collimating lens is configured to collimate the optical beam emitted from the laser diode; and
a second collimating lens optically aligned with the first collimating lens and the output facet,
wherein the beam twister is disposed between and optically aligned with the first collimating lens and the second collimating lens and configured to receive an optical beam emitted by the first collimating lens, and
wherein the second collimating lens is configured to collimate an optical beam emitted from the beam twister along the optical axis and transmit the collimated optical beam.

3. The photon source of claim 2, wherein each laser diode is mounted on the substrate and the substrate is configured to dissipate heat generated by each laser diode when each laser diode receives electrical power.

4. The photon source of claim 2, wherein each emitted optical beam emitted by each laser diode has a wavelength of 200 nm to 2000 nm.

5. The photon source of claim 2, wherein the first collimating lens is a fast-axis collimating lens and the second collimating lens is a slow-axis collimating lens.

6. The photon source of claim 2, wherein the beam twister is configured to rotate the optical beam emitted by the first collimating lens by a rotation angle.

7. The photon source of claim 6, wherein the rotation angle has a range of 1 degree to 90 degrees.

8. The photon source of claim 6, wherein the rotation angle has a range of 10 degree to 80 degrees.

9. The photon source of claim 6, wherein the rotation angle has a range of 20 degree to 70 degrees.

10. The photon source of claim 6, wherein the rotation angle has a range of 30 degree to 60 degrees.

11. The photon source of claim 6, wherein the rotation angle is 45 degrees.

12. The photon source of claim 1, wherein the plurality of optical sources is arranged symmetrically on the planar surface of the substrate.

13. The photon source of claim 12, wherein the plurality of optical sources posses an N-fold rotational axis of symmetry orthogonal to the planar surface of the substrate, wherein N is an integer that ranges from 2 to 50.

14. The photon source of claim 1, wherein the substrate defines a circular periphery.

15. The photon source of claim 1, wherein the substrate defines a polygonal periphery comprising a plurality of sides.

16. The photon source of claim 15, wherein the plurality of sides ranges from 2 to 50.

17. The photon source of claim 15, wherein each optical emitter of the plurality of optical sources is disposed adjacent to one of the plurality of sides of the polygonal periphery.

18. The photon source of claim 1, wherein the plurality of mirrors is cylindrically arranged.

19. The photon source of claim 1, wherein the plurality of optical emitters is cylindrically arranged.

20. The photon source of claim 1, further comprising an optical coupler configured to receive an optical output of the focus lens at a first coupler surface, and to receive an end of a fiber optic cable at a second coupler surface.

21. A photon source comprising:
a substrate defining a planar surface;
a focus lens disposed above the planar surface, the focus lens defining an acceptance angle; and
a plurality of optical sources, wherein each optical source comprises:
a mirror having a reflecting surface defining a first predetermined angle relative to the planar surface of the substrate, wherein the reflecting surface is configured to reflect a collimated optical beam incident on the reflecting surface away from the planar surface of the substrate at a second predetermined angle relative to the planar surface of the substrate; and
an optical emitter comprising a beam twister and disposed on the substrate wherein the optical emitter is optically aligned with the mirror along an optical axis and configured to emit the collimated optical beam along the optical axis,
wherein the mirror is configured to reflect the collimated optical beam within the acceptance angle of the focus lens;
wherein each mirror of the plurality of optical sources comprises a side of a polygonal pyramid disposed on the planar surface of the substrate, the polygonal pyramid having a pyramidal axis and a base defining a first diameter,
wherein the focus lens is disposed above the polygonal pyramid,
wherein a plurality of optical emitters comprises, collectively, each optical emitter of the plurality of optical sources, and the plurality of optical emitters is arranged in a ring-like configuration defining a longitudinal ring axis orthogonal to the planar surface and a second diameter, and
wherein the first diameter is smaller than the second diameter and the pyramidal axis is coaxial with the longitudinal ring axis.

22. A photon source comprising:
a substrate defining a planar surface;
a focus lens disposed above the planar surface, the focus lens defining an acceptance angle; and
a plurality of optical sources, wherein each optical source comprises:
a mirror disposed on the substrate having a reflecting surface defining a first predetermined angle relative to the planar surface of the substrate, wherein the reflecting surface is configured to reflect a collimated optical beam incident on the reflecting surface away from the planar surface of the substrate at a second predetermined angle relative to the planar surface of the substrate; and
an optical emitter disposed on the substrate,
wherein the optical emitter is optically aligned with the mirror along an optical axis and configured to emit the collimated optical beam along the optical axis,
wherein the optical emitter comprises a laser diode configured to emit an optical beam from an output facet,
wherein the laser diode is mounted on a sub-mount having a sub-mount plane orthogonal to the planar surface, and
wherein the mirror is configured to reflect the collimated optical beam within the acceptance angle of the focus lens;
wherein a plurality of mirrors comprises, collectively, each mirror of the plurality of optical sources, and the plurality of mirrors is arranged in a first ring-like configuration defining a first diameter, wherein the focus lens is disposed above the first ring-like configuration of the plurality of mirrors, wherein a plurality of optical emitters comprises, collectively, each optical emitter of the plurality of optical sources, and the plurality of optical emitters is arranged in a second ring-like configuration defining a second diameter, and wherein the first diameter is smaller than the second diameter and the second ring-like configuration is concentric with the first ring-like configuration.

23. The photon source of claim 22, wherein the optical emitter of each of the plurality of optical sources further comprises:

a first collimating lens optically aligned with the laser diode, wherein the first collimating lens is configured to collimate the optical beam emitted from the laser diode; and a second collimating lens optically aligned with the first collimating lens and the output facet, wherein the second collimating lens is configured to collimate an optical beam emitted from the first collimating lens along the optical axis and transmit the collimated optical beam.

24. The photon source of claim 23, wherein the first collimating lens is a fast-axis collimating lens and the second collimating lens is a slow-axis collimating lens.

* * * * *